(12) United States Patent
Guo et al.

(10) Patent No.: US 11,884,585 B2
(45) Date of Patent: Jan. 30, 2024

(54) ION EXCHANGEABLE GLASSES HAVING HIGH FRACTURE TOUGHNESS

(71) Applicant: CORNING INCORPORATED, Corning, NY (US)

(72) Inventors: Xiaoju Guo, Pittsford, NY (US); Peter Joseph Lezzi, Corning, NY (US); Jian Luo, Cupertino, CA (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 17/958,864

(22) Filed: Oct. 3, 2022

(65) Prior Publication Data

US 2023/0107789 A1   Apr. 6, 2023

Related U.S. Application Data

(60) Provisional application No. 63/251,776, filed on Oct. 4, 2021.

(51) Int. Cl.
*C03C 3/091* (2006.01)
*C03C 3/097* (2006.01)
(Continued)

(52) U.S. Cl.
CPC ............ *C03C 3/097* (2013.01); *C03C 21/002* (2013.01); *H05K 5/03* (2013.01)

(58) Field of Classification Search
CPC ................................ C03C 3/091; C03C 3/097
See application file for complete search history.

(56) References Cited

U.S. PATENT DOCUMENTS

| 11,584,681 | B2 * | 2/2023 | Cui ........................ C03C 21/002 |
| 2019/0127265 | A1 * | 5/2019 | Dejneka ................... C03C 3/093 |
| 2021/0155530 | A1 * | 5/2021 | Cui ........................... C03C 3/097 |

FOREIGN PATENT DOCUMENTS

| EP | 2075237 A1 | 7/2009 |
| WO | 2019/070724 A1 | 4/2019 |

(Continued)

OTHER PUBLICATIONS

Invitation to pay additional fee; PCT/US2022/045527; dated Dec. 19, 2020; 9 pages; European Patent Office.

(Continued)

*Primary Examiner* — Karl E Group
(74) *Attorney, Agent, or Firm* — Travis B. Gasa

(57) ABSTRACT

A glass composition includes greater than or equal to 60 mol % to less than or equal to 66 mol % $SiO_2$, greater than or equal to 14 mol % to less than or equal to 16 mol % $Al_2O_3$, greater than or equal to 7 mol % to less than or equal to 9 mol % $Li_2O$, greater than or equal to 4 mol % to less than or equal to 6 mol % $Na_2O$, greater than or equal to 0.5 mol % to less than or equal to 3 mol % $P_2O_5$, greater than or equal to 0.5 mol % to less than or equal to 6 mol % $B_2O_3$; and greater than 0 mol % to less than or equal to 1 mol % $TiO_2$. The glass composition may have a fracture toughness of greater than or equal 0.75 MPa√m. A glass composition includes $SiO_2$, $Al_2O_3$, $Li_2O$, $Na_2O$, $P_2O_5$, and $B_2O_3$, wherein a molar ratio of $Li_2O/Na_2O$ is greater than or equal to 1.2 to less than or equal to 2.0, the glass has a liquidus viscosity in the range from greater than or equal to 50 kP to less than or equal to 75 kP, and the glass has a $K_{IC}$ fracture toughness greater than or equal to 0.75 MPa·m$^{0.5}$. The glass composition is chemically strengthenable. The glass composition may be used in a glass-based article or a consumer electronic product.

30 Claims, 8 Drawing Sheets

(51) Int. Cl.
*H05K 5/03* (2006.01)
*C03C 21/00* (2006.01)

(56) References Cited

FOREIGN PATENT DOCUMENTS

| WO | 2019/089602 A1 | 5/2019 | | |
|----|----------------|--------|---|---|
| WO | 2021/108314 A1 | 6/2021 | | |
| WO | WO-2021108314 A1 * | 6/2021 | ........... | C03C 21/002 |

OTHER PUBLICATIONS

K. Pattabhi Rami Reddy, et al., "Fracture Toughness Measurement of Glass and Ceramic Materials Using Chevron-Notched Specimens", J. Am. Ceram. Soc., 1988, vol. 71, No. 6, pp. C-310-C-313.
R. T. Bubsey, et al., "Closed-Form Expressions for Crack-Mouth Displacements and Stress Intensity Factors for Chevron-Notched Short Bar and Short Rod Specimens Based on Experimental Compliance. Measurements", NASA, 1992, pp. 1-32.

* cited by examiner

ION EXCHANGEABLE GLASSES HAVING HIGH FRACTURE TOUGHNESS

This application claims the benefit of priority of U.S. Provisional Application Ser. No. 63/251,776 filed on Oct. 4, 2021, the content of which is relied upon and incorporated herein by reference in its entirety.

BACKGROUND

Field

The present specification generally relates to glass compositions suitable for use as cover glass for electronic devices. More specifically, the present specification is directed to ion exchangeable glasses that may be formed into cover glass for electronic devices.

Technical Background

The mobile nature of portable devices, such as smart phones, tablets, portable media players, personal computers, and cameras, makes these devices particularly vulnerable to accidental dropping on hard surfaces, such as the ground. These devices typically incorporate cover glasses, which may become damaged upon impact with hard surfaces. In many of these devices, the cover glasses function as display covers, and may incorporate touch functionality, such that use of the devices is negatively impacted when the cover glasses are damaged.

There are two major failure modes of cover glass when the associated portable device is dropped on a hard surface. One of the modes is flexure failure, which is caused by bending of the glass when the device is subjected to dynamic load from impact with the hard surface. The other mode is sharp contact failure, which is caused by introduction of damage to the glass surface. Impact of the glass with rough hard surfaces, such as asphalt, granite, etc., can result in sharp indentations in the glass surface. These indentations become failure sites in the glass surface from which cracks may develop and propagate.

Glass can be made more resistant to flexure failure by the ion-exchange technique, which involves inducing compressive stress in the glass surface. However, the ion-exchanged glass will still be vulnerable to dynamic sharp contact, owing to the high stress concentration caused by local indentations in the glass from the sharp contact.

It has been a continuous effort for glass makers and handheld device manufacturers to improve the resistance of handheld devices to sharp contact failure. Solutions range from coatings on the cover glass to bezels that prevent the cover glass from impacting the hard surface directly when the device drops on the hard surface. However, due to the constraints of aesthetic and functional requirements, it is very difficult to completely prevent the cover glass from impacting the hard surface.

It is also desirable that portable devices be as thin as possible. Accordingly, in addition to strength, it is also desired that glasses to be used as cover glass in portable devices be made as thin as possible. Thus, in addition to increasing the strength of the cover glass, it is also desirable for the glass to have mechanical characteristics that allow it to be formed by processes that are capable of making thin glass-based articles, such as thin glass sheets.

Accordingly, a need exists for glasses that can be strengthened, such as by ion exchange, and that have the mechanical properties that allow them to be formed as thin glass-based articles.

SUMMARY

According to aspect (1), a glass is provided. The glass comprising: greater than or equal to 60 mol % to less than or equal to 66 mol % $SiO_2$; greater than or equal to 14 mol % to less than or equal to 16 mol % $Al_2O_3$; greater than or equal to 7 mol % to less than or equal to 9 mol % $Li_2O$; greater than or equal to 4 mol % to less than or equal to 6 mol % $Na_2O$; greater than or equal to 0.5 mol % to less than or equal to 3 mol % $P_2O_5$; greater than or equal to 0.5 mol % to less than or equal to 6 mol % $B_2O_3$; and greater than 0 mol % to less than or equal to 1 mol % $TiO_2$.

According to aspect (2), the glass of aspect (1) is provided, comprising greater than 0 mol % to less than or equal to 0.5 mol % $K_2O$.

According to aspect (3), the glass of any of aspect (1) to the preceding aspect is provided, comprising greater than or equal to 0.1 mol % to less than or equal to 0.5 mol % $TiO_2$.

According to aspect (4), the glass of any of aspect (1) to the preceding aspect is provided, comprising greater than or equal to 0 mol % to less than or equal to 4 mol % MgO.

According to aspect (5), the glass of any of aspect (1) to the preceding aspect is provided, comprising greater than or equal to 0.1 mol % to less than or equal to 1 mol % MgO.

According to aspect (6), the glass of any of aspect (1) to the preceding aspect is provided, comprising greater than or equal to 0 mol % to less than or equal to 3 mol % CaO.

According to aspect (7), the glass of any of aspect (1) to the preceding aspect is provided, comprising greater than or equal to 1 mol % to less than or equal to 2 mol % CaO.

According to aspect (8), the glass of any of aspect (1) to the preceding aspect is provided, comprising greater than or equal to 0 mol % to less than or equal to 4 mol % SrO.

According to aspect (9), the glass of any of aspect (1) to the preceding aspect is provided, comprising greater than or equal to 0.5 mol % to less than or equal to 2 mol % SrO.

According to aspect (10), the glass of any of aspect (1) to the preceding aspect is provided, comprising greater than or equal to 0 mol % to less than or equal to 1 mol % ZnO.

According to aspect (11), the glass of any of aspect (1) to the preceding aspect is provided, comprising greater than or equal to 0 mol % to less than or equal to 0.1 mol % $SnO_2$.

According to aspect (12), the glass of any of aspect (1) to the preceding aspect is provided, comprising greater than or equal to 64 mol % to less than or equal to 65 mol % $SiO_2$.

According to aspect (13), the glass of any of aspect (1) to the preceding aspect is provided, comprising greater than or equal to 15 mol % to less than or equal to 16 mol % $Al_2O_3$.

According to aspect (14), the glass of any of aspect (1) to the preceding aspect is provided, comprising greater than or equal to 7 mol % to less than or equal to 8 mol % $Li_2O$.

According to aspect (15), the glass of any of aspect (1) to the preceding aspect is provided, comprising greater than or equal to 4 mol % to less than or equal to 5 mol % $Na_2O$.

According to aspect (16), the glass of any of aspect (1) to the preceding aspect is provided, comprising greater than or equal to 0.5 mol % to less than or equal to 1.5 mol % $P_2O_5$.

According to aspect (17), the glass of any of aspect (1) to the preceding aspect is provided, comprising greater than or equal to 3 mol % to less than or equal to 4 mol % $B_2O_3$.

According to aspect (18), the glass of any of aspect (1) to the preceding aspect is provided, wherein the glass is substantially free of $Fe_2O_3$.

According to aspect (19), the glass of any of aspect (1) to the preceding aspect is provided, wherein the glass is substantially free of $ZrO_2$.

According to aspect (20), the glass of any of aspect (1) to the preceding aspect is provided, wherein the glass is substantially free of $Ta_2O_5$, $HfO_2$, $La_2O_3$, and $Y_2O_3$.

According to aspect (21), the glass of any of aspect (1) to the preceding aspect is provided, wherein a molar ratio of $Li_2O/Na_2O$ is greater than or equal to 1.2 to less than or equal to 2.0.

According to aspect (22), the glass of any of aspect (1) to the preceding aspect is provided, wherein a molar ratio of $Li_2O/Na_2O$ is greater than or equal to 1.6 to less than or equal to 2.0.

According to aspect (23), the glass of any of aspect (1) to the preceding aspect is provided, wherein the glass has a liquidus viscosity in the range from greater than or equal to 50 kP to less than or equal to 75 kP.

According to aspect (24), the glass of any of aspect (1) to the preceding aspect is provided, wherein the glass has a Kw fracture toughness greater than or equal to 0.75 MPa·m$^{0.5}$.

According to aspect (25), a glass is provided. The glass comprising: $SiO_2$; $Al_2O_3$; $Li_2O$; $Na_2O$; $P_2O_5$; and $B_2O_3$, wherein: a molar ratio of $Li_2O/Na_2O$ is greater than or equal to 1.2 to less than or equal to 2.0, the glass has a liquidus viscosity in the range from greater than or equal to 50 kP to less than or equal to 75 kP, and the glass has a $K_{IC}$ fracture toughness greater than or equal to 0.75 MPa·m$^{0.5}$.

According to aspect (26), the glass of aspect (25) is provided, further comprising $TiO_2$.

According to aspect (27), the glass of any of aspect (25) to the preceding aspect is provided, further comprising $K_2O$.

According to aspect (28), the glass of any of aspect (25) to the preceding aspect is provided, further comprising CaO.

According to aspect (29), the glass of any of aspect (25) to the preceding aspect is provided, further comprising MgO.

According to aspect (30), the glass of any of aspect (25) to the preceding aspect is provided, further comprising SrO.

According to aspect (31), the glass of any of aspect (25) to the preceding aspect is provided, further comprising $SnO_2$.

According to aspect (32), the glass of any of aspect (25) to the preceding aspect is provided, wherein the glass is substantially free of $Fe_2O_3$.

According to aspect (33), the glass of any of aspect (25) to the preceding aspect is provided, wherein the glass is substantially free of $ZrO_2$.

According to aspect (34), the glass of any of aspect (25) to the preceding aspect is provided, wherein the glass is substantially free of $Ta_2O_5$, $HfO_2$, $La_2O_3$, and $Y_2O_3$.

According to aspect (35), a method is provided. The method comprising: ion exchanging a glass-based substrate in a molten salt bath to form a glass-based article, wherein the glass-based article comprises a compressive stress layer extending from a surface of the glass-based article to a depth of compression, the glass-based article comprises a central tension region, and the glass-based substrate comprises the glass of any of the preceding claims.

According to aspect (36), the method of aspect (35) is provided, wherein the molten salt bath comprises $NaNO_3$.

According to aspect (37), the method of any of aspect (35) to the preceding aspect is provided, wherein the molten salt bath comprises $KNO_3$.

According to aspect (38), the method of any of aspect (35) to the preceding aspect is provided, wherein the molten salt bath is at a temperature greater than or equal to 380° C. to less than or equal to 470° C.

According to aspect (39), the method of any of aspect (35) to the preceding aspect is provided, wherein the ion exchanging extends for a time period greater than or equal to 10 minutes to less than or equal to 24 hours.

According to aspect (40), the method of any of aspect (35) to the preceding aspect is provided, further comprising ion exchanging the glass-based article in a second molten salt bath.

According to aspect (41), the method of the preceding aspect is provided, wherein the second molten salt bath comprises $KNO_3$.

According to aspect (42), a glass-based article is provided. The glass-based article comprising: a compressive stress layer extending from a surface of the glass-based article to a depth of compression; a central tension region; and a composition at a center of the glass-based article comprising: greater than or equal to 60 mol % to less than or equal to 66 mol % $SiO_2$; greater than or equal to 14 mol % to less than or equal to 16 mol % $Al_2O_3$; greater than or equal to 7 mol % to less than or equal to 9 mol % $Li_2O$; greater than or equal to 4 mol % to less than or equal to 6 mol % $Na_2O$; greater than or equal to 0.5 mol % to less than or equal to 3 mol % $P_2O_5$; greater than or equal to 0.5 mol % to less than or equal to 6 mol % $B_2O_3$; and greater than 0 mol % to less than or equal to 1 mol % $TiO_2$.

According to aspect (43), a glass-based article is provided. The glass-based article comprising: a compressive stress layer extending from a surface of the glass-based article to a depth of compression; a central tension region; and a composition at a center of the glass-based article comprising: $SiO_2$; $Al_2O_3$; $Li_2O$; $Na_2O$; $P_2O_5$; and $B_2O_3$, wherein a molar ratio of $Li_2O/Na_2O$ is greater than or equal to 1.2 to less than or equal to 2.0, and a glass having the same composition and microstructure as the composition at the center of the glass-based article has a liquidus viscosity in the range from greater than or equal to 50 kP to less than or equal to 75 kP and a $K_{IC}$ fracture toughness greater than or equal to 0.75 MPa·m$^{0.5}$.

According to aspect (44), the glass-based article of any of aspect (42) to the preceding aspect is provided, wherein the compressive stress layer comprises a compressive stress greater than or equal to 500 MPa to less than or equal to 1500 MPa.

According to aspect (45), the glass-based article of any of aspect (42) to the preceding aspect is provided, wherein the central tension region comprises a maximum central tension greater than or equal to 60 MPa to less than or equal to 160 MPa.

According to aspect (46), the glass-based article of any of aspect (42) to the preceding aspect is provided, wherein the depth of compression is greater than or equal to 0.20t to less than or equal to 0.25t, where t is the thickness of the glass-based article.

According to aspect (47), the glass-based article of any of aspect (42) to the preceding aspect is provided, wherein the compressive stress layer comprises a compressive stress spike extending from the surface of the glass-based article to a depth of compressive stress spike, and the depth of compressive stress spike is greater than or equal to 3 μm to less than or equal to 10 μm.

According to aspect (48), the glass-based article of any of aspect (42) to the preceding aspect is provided, wherein the glass-based article has a thickness t greater than or equal to 0.2 mm to less than or equal to 2 mm.

According to aspect (49), the glass-based article of any of aspect (42) to the preceding aspect is provided, wherein the composition at the center of the glass-based article comprises: greater than 0 mol % to less than or equal to 0.5 mol % $K_2O$.

According to aspect (50), the glass-based article of any of aspect (42) to the preceding aspect is provided, wherein the composition at the center of the glass-based article comprises: greater than or equal to 0.1 mol % to less than or equal to 0.5 mol % $TiO_2$.

According to aspect (51), the glass-based article of any of aspect (42) to the preceding aspect is provided, wherein the composition at the center of the glass-based article comprises: greater than or equal to 0 mol % to less than or equal to 4 mol % MgO.

According to aspect (52), the glass-based article of any of aspect (42) to the preceding aspect is provided, wherein the composition at the center of the glass-based article comprises: greater than or equal to 0.1 mol % to less than or equal to 1 mol % MgO.

According to aspect (53), the glass-based article of any of aspect (42) to the preceding aspect is provided, wherein the composition at the center of the glass-based article comprises: greater than or equal to 0 mol % to less than or equal to 3 mol % CaO.

According to aspect (54), the glass-based article of any of aspect (42) to the preceding aspect is provided, wherein the composition at the center of the glass-based article comprises: greater than or equal to 1 mol % to less than or equal to 2 mol % CaO.

According to aspect (55), the glass-based article of any of aspect (42) to the preceding aspect is provided, wherein the composition at the center of the glass-based article comprises: greater than or equal to 0 mol % to less than or equal to 4 mol % SrO.

According to aspect (56), the glass-based article of any of aspect (42) to the preceding aspect is provided, wherein the composition at the center of the glass-based article comprises: greater than or equal to 0.5 mol % to less than or equal to 2 mol % SrO.

According to aspect (57), the glass-based article of any of aspect (42) to the preceding aspect is provided, wherein the composition at the center of the glass-based article comprises: greater than or equal to 0 mol % to less than or equal to 1 mol % ZnO.

According to aspect (58), the glass-based article of any of aspect (42) to the preceding aspect is provided, wherein the composition at the center of the glass-based article comprises: greater than or equal to 0 mol % to less than or equal to 0.1 mol % $SnO_2$.

According to aspect (59), the glass-based article of any of aspect (42) to the preceding aspect is provided, wherein the composition at the center of the glass-based article comprises: greater than or equal to 64 mol % to less than or equal to 65 mol % $SiO_2$.

According to aspect (60), the glass-based article of any of aspect (42) to the preceding aspect is provided, wherein the composition at the center of the glass-based article comprises: greater than or equal to 15 mol % to less than or equal to 16 mol % $Al_2O_3$.

According to aspect (61), the glass-based article of any of aspect (42) to the preceding aspect is provided, wherein the composition at the center of the glass-based article comprises: greater than or equal to 7 mol % to less than or equal to 8 mol % $Li_2O$.

According to aspect (62), the glass-based article of any of aspect (42) to the preceding aspect is provided, wherein the composition at the center of the glass-based article comprises: greater than or equal to 4 mol % to less than or equal to 5 mol % $Na_2O$.

According to aspect (63), the glass-based article of any of aspect (42) to the preceding aspect is provided, wherein the composition at the center of the glass-based article comprises: greater than or equal to 0.5 mol % to less than or equal to 1.5 mol % $P_2O_5$.

According to aspect (64), the glass-based article of any of aspect (42) to the preceding aspect is provided, wherein the composition at the center of the glass-based article comprises: greater than or equal to 3 mol % to less than or equal to 4 mol % $B_2O_3$.

According to aspect (65), the glass-based article of any of aspect (42) to the preceding aspect is provided, wherein the composition at the center of the glass-based article is substantially free of $Fe_2O_3$.

According to aspect (66), the glass-based article of any of aspect (42) to the preceding aspect is provided, wherein the composition at the center of the glass-based article is substantially free of $ZrO_2$.

According to aspect (67), the glass-based article of any of aspect (42) to the preceding aspect is provided, wherein the composition at the center of the glass-based article is substantially free of $Ta_2O_5$, $HfO_2$, $La_2O_3$, and $Y_2O_3$.

According to aspect (68), the glass-based article of any of aspect (42) to the preceding aspect is provided, wherein the composition at the center of the glass-based article has a molar ratio of $Li_2O/Na_2O$ greater than or equal to 1.6 to less than or equal to 2.0.

According to aspect (69), a consumer electronic product is provided. The consumer electronic product comprising: a housing having a front surface, a back surface and side surfaces; electrical components provided at least partially within the housing, the electrical components including at least a controller, a memory, and a display, the display being provided at or adjacent the front surface of the housing; and a cover substrate disposed over the display, wherein at least a portion of at least one of the housing and the cover substrate comprises the glass-based article of any of aspect (42) to the preceding aspect.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments and are incorporated into and constitute a part of this specification. The drawings illustrate the various embodiments described herein, and together with the description serve to explain the principles and operations of the claimed subject matter.

DETAILED DESCRIPTION

Figure 1:
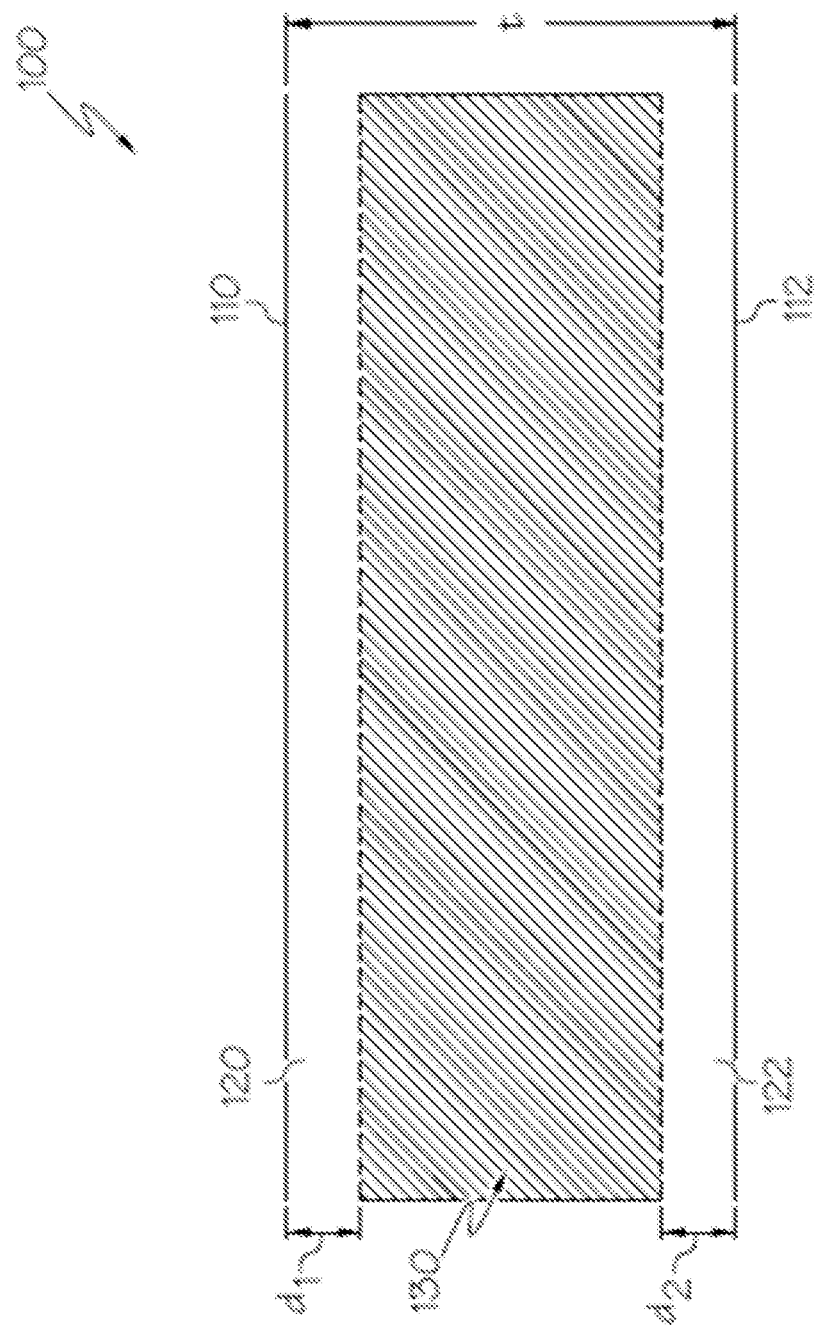
FIG. 1 schematically depicts a cross section of a glass-based article having compressive stress regions according to embodiments described and disclosed herein.

Reference will now be made in detail to lithium aluminosilicate glasses according to various embodiments. Lithium aluminosilicate glasses have good ion exchangeability, and chemical strengthening processes have been used to achieve high strength and high toughness properties in lithium aluminosilicate glasses. Lithium aluminosilicate glasses are highly ion exchangeable glasses with high glass quality. The substitution of $Al_2O_3$ into the silicate glass network increases the interdiffusivity of monovalent cations during ion exchange. By chemical strengthening in a molten salt bath (e.g., $KNO_3$ or $NaNO_3$), glasses with high strength, high toughness, and high indentation cracking resistance can be achieved. The stress profiles achieved through chemical strengthening may have a variety of shapes that increase the drop performance, strength, toughness, and other attributes of the glass-based articles.

Therefore, lithium aluminosilicate glasses with good physical properties, chemical durability, and ion exchangeability have drawn attention for use as cover glass. In particular, lithium containing aluminosilicate glasses, which have higher fracture toughness and reasonable raw material costs, are provided herein. Through different ion exchange processes, greater central tension (CT), depth of compression (DOC), and high compressive stress (CS) can be achieved. However, the addition of lithium in the aluminosilicate glass may reduce the melting point, softening point, or liquidus viscosity of the glass.

In embodiments of glass compositions described herein, the concentration of constituent components (e.g., $SiO_2$, $Al_2O_3$, $Li_2O$, and the like) are given in mole percent (mol %) on an oxide basis, unless otherwise specified. Components of the alkali aluminosilicate glass composition according to embodiments are discussed individually below. It should be understood that any of the variously recited ranges of one component may be individually combined with any of the variously recited ranges for any other component. As used herein, a trailing 0 in a number is intended to represent a significant digit for that number. For example, the number "1.0" includes two significant digits, and the number "1.00" includes three significant digits.

As utilized herein, a "glass substrate" refers to a glass piece that has not been ion exchanged. Similarly, a "glass article" refers to a glass piece that has been ion exchanged and is formed by subjecting a glass substrate to an ion exchange process. A "glass-based substrate" and a "glass-based article" are defined accordingly and include glass substrates and glass articles as well as substrates and articles that are made wholly or partly of glass, such as glass substrates that include a surface coating. While glass substrates and glass articles may generally be referred to herein for the sake of convenience, the descriptions of glass substrates and glass articles should be understood to apply equally to glass-based substrates and glass-based articles.

Disclosed herein are $P_2O_5$ and $B_2O_3$ containing lithium aluminosilicate glass compositions that exhibit a high fracture toughness ($K_{IC}$). In some embodiments, the glass compositions are characterized by a $K_{IC}$ fracture toughness value of at least 0.75 MPa√m. The glasses described herein are able to achieve these fracture toughness values without the inclusion of additives, such as $ZrO_2$, $Ta_2O_5$, $TiO_2$, $HfO_2$, $La_2O_3$, and $Y_2O_3$, that increase the fracture toughness but are expensive and may have limited commercial availability. In this respect the glasses disclosed herein provide comparable or improved performance with reduced manufacturing costs.

While scratch performance is desirable, drop performance is the leading attribute for glass-based articles incorporated into mobile electronic devices. Fracture toughness and stress at depth are critical for improved drop performance on rough surfaces. For this reason, maximizing the amount of stress that can be provided in a glass before reaching frangibility limit increases the stress at depth and the rough surface drop performance. The fracture toughness is known to control the frangibility limit and increasing the fracture toughness increases the frangibility limit. The glass compositions disclosed herein have a high fracture toughness and are capable of achieving high compressive stress levels while remaining non-frangible. These characteristics of the glass compositions enable the development of improved stress profiles designed to address particular failure modes. This capability allows the ion exchanged glass-based articles produced from the glass compositions described herein to be customized with different stress profiles to address particular failure modes of concern.

The compositions described herein are selected to achieve high fracture toughness values while also maintaining a desired degree of manufacturability. The compositions include high amounts of $Al_2O_3$ and $Li_2O$ to produce a desired fracture toughness while maintaining compatibility with desired manufacturing limits. The drop performance of ion exchanged glass-based articles formed from the glass compositions described herein is improved by increasing the depth of compression (DOC), which may be achieved at least in part by selecting a high Li/Na molar ratio. The glass compositions described herein provide improved ion exchange performance, as evidenced by an increased central tension capability and increased ion exchange speed, while also avoiding volatility issues at free surfaces during manufacturing that may be introduced by $B_2O_3$ and $P_2O_5$ contents that are too high.

In the glass compositions described herein, $SiO_2$ is the largest constituent and, as such, $SiO_2$ is the primary constituent of the glass network formed from the glass composition. Pure $SiO_2$ has a relatively low CTE. However, pure $SiO_2$ has a high melting point. Accordingly, if the concentration of $SiO_2$ in the glass composition is too high, the formability of the glass composition may be diminished as higher concentrations of $SiO_2$ increase the difficulty of melting the glass, which, in turn, adversely impacts the formability of the glass. If the concentration of $SiO_2$ in the glass composition is too low the chemical durability of the glass may be diminished, and the glass may be susceptible to surface damage during post-forming treatments. In embodiments, the glass composition generally comprises $SiO_2$ in an amount of from greater than or equal to 60 mol % to less than or equal to 66 mol %, such as greater than or equal to 60.5 mol % to less than or equal to 65.5 mol %, greater than or equal to 61 mol % to less than or equal to 65 mol %, greater than or equal to 61.5 mol % to less than or equal to 64.5 mol %, greater than or equal to 62 mol % to less than or equal to 64 mol %, greater than or equal to 62.5 mol % to less than or equal to 63.5 mol %, greater than or equal to 63 mol % to less than or equal to 65 mol %, greater than or equal to 64 mol % to less than or equal to 65 mol %, and all ranges and sub-ranges between the foregoing values.

The glass compositions include $Al_2O_3$. $Al_2O_3$ may serve as a glass network former, similar to $SiO_2$. $Al_2O_3$ may increase the viscosity of the glass composition due to its tetrahedral coordination in a glass melt formed from a glass composition, decreasing the formability of the glass composition when the amount of $Al_2O_3$ is too high. However, when the concentration of $Al_2O_3$ is balanced against the concentration of $SiO_2$ and the concentration of alkali oxides in the glass composition, $Al_2O_3$ can reduce the liquidus temperature of the glass melt, thereby enhancing the liquidus viscosity and improving the compatibility of the glass composition with certain forming processes. The inclusion of $Al_2O_3$ in the glass compositions enables the high fracture toughness values described herein. In embodiments, the glass composition comprises $Al_2O_3$ in a concentration of from greater than or equal to 14 mol % to less than or equal to 16 mol %, such as greater than or equal to 14.0 mol % to less than or equal to 16.0 mol %, greater than or equal to 14.5 mol % to less than or equal to 15.5 mol %, greater than or equal to 15.0 mol % to less than or equal to 15.5 mol %, greater than or equal to 15 mol % to less than or equal to 16 mol %, and all ranges and sub-ranges between the foregoing values.

The glass compositions include $Li_2O$. The inclusion of $Li_2O$ in the glass composition allows for better control of an ion exchange process and further reduces the softening point of the glass, thereby increasing the manufacturability of the glass. The presence of $Li_2O$ in the glass compositions also allows the formation of a stress profile with a parabolic shape. The $Li_2O$ in the glass compositions enables the high fracture toughness values described herein. In embodiments, the glass composition comprises $Li_2O$ in an amount from greater than or equal to 7 mol % to less than or equal to 9 mol %, such as greater than or equal to 7.0 mol % to less than or equal to 9.0 mol %, greater than or equal to 7.5 mol % to less than or equal to 8.5 mol %, greater than or equal to 8.0 mol % to less than or equal to 8.5 mol %, greater than or equal to 7 mol % to less than or equal to 8 mol %, and all ranges and sub-ranges between the foregoing values.

The glass compositions described herein include $Na_2O$. $Na_2O$ may aid in the ion-exchangeability of the glass composition, and improve the formability, and thereby manufacturability, of the glass composition. However, if too much $Na_2O$ is added to the glass composition, the CTE may be too low, and the melting point may be too high. Additionally, if too much $Na_2O$ is included in the glass relative to the amount of $Li_2O$ the ability of the glass to achieve a deep depth of compression when ion exchanged may be reduced. In embodiments, the glass composition comprises $Na_2O$ in an amount from greater than or equal to 4 mol % to less than or equal to 6 mol %, such as greater than or equal to 4.0 mol % to less than or equal to 6.0 mol %, greater than or equal to 4.5 mol % to less than or equal to 5.5 mol %, greater than or equal to 5.0 mol % to less than or equal to 5.5 mol %, greater than or equal to 4 mol % to less than or equal to 5 mol %, and all ranges and sub-ranges between the foregoing values.

The glass compositions described herein include $P_2O_5$. The inclusion of $P_2O_5$ increases the diffusivity of ions in the glass, increasing the speed of the ion exchange process. If too much $P_2O_5$ is included in the composition the amount of compressive stress imparted in an ion exchange process may be reduced and volatility at free surfaces during manufacturing may increase to undesirable levels. In embodiments, the glass composition comprises $P_2O_5$ in an amount from greater than or equal to 0.5 mol % to less than or equal to 3 mol %, such as greater than or equal to 1.0 mol % to less than or equal to 3.0 mol %, greater than or equal to 1 mol % to less than or equal to 2.5 mol %, greater than or equal to 1.5 mol % to less than or equal to 2.0 mol %, greater than or equal to 0.5 mol % to less than or equal to 2 mol %, greater than or equal to 0.5 mol % to less than or equal to 1.5 mol %, and all ranges and sub-ranges between the foregoing values.

The glass compositions described herein include $B_2O_3$. The inclusion of $B_2O_3$ increases the fracture toughness of the glass. In particular, the glass compositions include boron in the trigonal configuration which increases the Knoop scratch threshold and fracture toughness of the glasses. If too much $B_2O_3$ is included in the composition the amount of compressive stress imparted in an ion exchange process may be reduced and volatility at free surfaces during manufacturing may increase to undesirable levels. In embodiments, the glass composition comprises $B_2O_3$ in an amount from greater than or equal to 0.5 mol % to less than or equal to 6 mol %, such as greater than or equal to 1.0 mol % to less than or equal to 6.0 mol %, greater than or equal to 1 mol % to less than or equal to 5.5 mol %, greater than or equal to 1.5 mol % to less than or equal to 5.0 mol %, greater than or equal to 2.0 mol % to less than or equal to 5 mol %, greater than or equal to 2 mol % to less than or equal to 4.5 mol %, greater than or equal to 2.5 mol % to less than or equal to 4.0 mol %, greater than or equal to 3.0 mol % to less than or equal to 4 mol %, greater than or equal to 3 mol % to less than or equal to 3.5 mol %, greater than or equal to 3 mol % to less than or equal to 4 mol %, and all ranges and sub-ranges between the foregoing values.

The glass compositions described herein generally include $TiO_2$. The inclusion of too much $TiO_2$ in the glass composition may result in the glass being susceptible to devitrification and/or exhibiting an undesirable coloration as well as undesirably changing the liquidus. The inclusion of $TiO_2$ in the glass composition prevents the undesirable discoloration of the glass if exposed to intense ultraviolet light, such as during post-processing treatments. In embodiments, the glass composition comprises $TiO_2$ in an amount from greater than 0 mol % to less than or equal to 1 mol %, such as greater than or equal to 0.1 mol % to less than or equal to 1.0 mol %, greater than or equal to 0.2 mol % to less than or equal to 0.9 mol %, greater than or equal to 0.3 mol % to less than or equal to 0.8 mol %, greater than or equal to 0.4 mol % to less than or equal to 0.7 mol %, greater than or equal to 0.5 mol % to less than or equal to 0.6 mol %, greater than or equal to 0.1 mol % to less than or equal to 0.2 mol %, greater than or equal to 0.1 mol % to less than or equal to 0.5 mol %, and all ranges and sub-ranges between the foregoing values.

The glass compositions may include $K_2O$. The inclusion of $K_2O$ in the glass composition increases the potassium diffusivity in the glass, enabling a deeper depth of a compressive stress spike ($DOL_{SP}$) to be achieved in a shorter amount of ion exchange time. If too much $K_2O$ is included in the composition the amount of compressive stress imparted during an ion-exchange process may be reduced. In embodiments, the glass composition comprises $K_2O$ in an amount from greater than 0 mol % to less than or equal to 0.5 mol %, such as greater than or equal to 0.1 mol % to less than or equal to 0.4 mol %, greater than or equal to 0.2 mol % to less than or equal to 0.3 mol %, and all ranges and sub-ranges between the foregoing values.

The glass compositions described herein may include MgO. MgO may lower the viscosity of a glass, which enhances the formability and manufacturability of the glass. The inclusion of MgO in a glass composition may also improve the strain point and the Young's modulus of the glass composition. However, if too much MgO is added to the glass composition, the liquidus viscosity may be too low for compatibility with desirable forming techniques. The addition of too much MgO may also increase the density and the CTE of the glass composition to undesirable levels. The inclusion of MgO in the glass composition also helps to achieve the high fracture toughness values described herein. In embodiments, the glass composition comprises MgO in an amount from greater than or equal to 0 mol % to less than or equal to 4 mol %, such as greater than 0 mol % to less than or equal to 4.0 mol %, greater than or equal to 0.5 mol % to less than or equal to 3.5 mol %, greater than or equal to 1 mol % to less than or equal to 3 mol %, greater than or equal to 1.0 mol % to less than or equal to 3.0 mol %, greater than or equal to 1.5 mol % to less than or equal to 2.5 mol %, greater than or equal to 1 mol % to less than or equal to 2 mol %, greater than or equal to 2.0 mol % to less than or equal to 3 mol %, greater than or equal to 0.1 mol % to less than or equal to 1 mol %, and all ranges and sub-ranges between the foregoing values. In embodiments, the glass composition is substantially free or free of MgO. As used herein, the term "substantially free" means that the component is not purposefully added as a component of the batch material even though the component may be present in the final glass composition in very small amounts as a contaminant, such as less than 0.1 mol %.

The glass compositions described herein may include CaO. CaO may lower the viscosity of a glass, which may enhance the formability, the strain point, and the Young's modulus. However, if too much CaO is added to the glass composition, the density and the CTE of the glass composition may increase to undesirable levels and the ion exchangeability of the glass may be undesirably impeded. The inclusion of CaO in the glass composition also helps to achieve the high fracture toughness values described herein. In embodiments, the glass composition comprises CaO in an amount from greater than or equal to 0 mol % to less than or equal to 3 mol %, such as greater than 0 mol % to less than or equal to 3.0 mol %, greater than or equal to 0.5 mol % to less than or equal to 2.5 mol %, greater than or equal to 1 mol % to less than or equal to 2 mol %, greater than or equal to 1.0 mol % to less than or equal to 2.0 mol %, greater than or equal to 1.5 mol % to less than or equal to 2.0 mol %, greater than or equal to 1 mol % to less than or equal to 2 mol %, and all ranges and sub-ranges between the foregoing values. In embodiments, the glass composition is substantially free or free of CaO.

The glass compositions described herein may include SrO. SrO may lower the viscosity of a glass, which may enhance the formability, the strain point, and the Young's modulus. However, if too much SrO is added to the glass composition, the density and the CTE of the glass composition may increase to undesirable levels and the ion exchangeability of the glass may be undesirably impeded. The inclusion of SrO in the glass composition also helps to achieve the high fracture toughness values described herein. In embodiments, the glass composition comprises SrO in an amount from greater than or equal to 0 mol % to less than or equal to 4 mol %, such as greater than 0 mol % to less than or equal to 4.0 mol %, greater than or equal to 0.5 mol % to less than or equal to 3.5 mol %, greater than or equal to 1 mol % to less than or equal to 3 mol %, greater than or equal to 1.0 mol % to less than or equal to 3.0 mol %, greater than or equal to 1.5 mol % to less than or equal to 2.5 mol %, greater than or equal to 1 mol % to less than or equal to 2 mol %, greater than or equal to 2.0 mol % to less than or equal to 3 mol %, greater than or equal to 0.5 mol % to less than or equal to 2 mol %, and all ranges and sub-ranges between the foregoing values. In embodiments, the glass composition is substantially free or free of SrO.

The glass compositions described herein may include ZnO. ZnO may lower the viscosity of a glass, which may enhance the formability, the strain point, and the Young's modulus. However, if too much ZnO is added to the glass composition, the density and the CTE of the glass composition may increase to undesirable levels. The inclusion of ZnO in the glass composition also helps to achieve the high fracture toughness values described herein and provides protection against UV induced discoloration. In embodiments, the glass composition comprises ZnO in an amount from greater than or equal to 0 mol % to less than or equal to 1 mol %, such as greater than 0 mol % to less than or equal to 1.0 mol %, greater than or equal to 0.1 mol % to less than or equal to 0.9 mol %, greater than or equal to 0.2 mol % to less than or equal to 0.8 mol %, greater than or equal to 0.3 mol % to less than or equal to 0.7 mol %, greater than or equal to 0.4 mol % to less than or equal to 0.6 mol %, greater than or equal to 0.1 mol % to less than or equal to 0.5 mol %, from greater than or equal to 0 mol % to less than or equal to 0.3 mol %, and all ranges and sub-ranges between the foregoing values. In embodiments, the glass composition is substantially free or free of ZnO.

The glass compositions may optionally include one or more fining agents. In embodiments, the fining agent may include, for example, $SnO_2$. In embodiments, $SnO_2$ may be present in the glass composition in an amount less than or equal to 0.2 mol %, such as from greater than or equal to 0 mol % to less than or equal to 0.2 mol %, greater than or equal to 0 mol % to less than or equal to 0.1 mol %, greater than or equal to 0 mol % to less than or equal to 0.05 mol %, greater than or equal to 0.1 mol % to less than or equal to 0.2 mol %, and all ranges and sub-ranges between the foregoing values. In some embodiments, the glass composition may be substantially free or free of $SnO_2$. In embodiments, the glass composition may be substantially free of one or both of arsenic and antimony. In other embodiments, the glass composition may be free of one or both of arsenic and antimony.

The glass compositions described herein may be formed primarily from $SiO_2$, $Al_2O_3$, $Li_2O$, $Na_2O$, $P_2O_5$, and $B_2O_3$. In embodiments, the glass compositions are substantially free or free of components other than $SiO_2$, $Al_2O_3$, $Li_2O$, $Na_2O$, $P_2O_5$, $B_2O_3$, and $TiO_2$. In embodiments, the glass compositions are substantially free or free of components other than $SiO_2$, $Al_2O_3$, $Li_2O$, $Na_2O$, $P_2O_5$, $B_2O_3$, $TiO_2$, and a fining agent. In embodiments, the glass compositions are substantially free or free of components other than $SiO_2$, $Al_2O_3$, $Li_2O$, $Na_2O$, $P_2O_5$, $B_2O_3$, $TiO_2$, $K_2O$, $CaO$, $MgO$, $SrO$, and a fining agent.

In embodiments, the glass composition may be substantially free or free of $Fe_2O_3$. Iron is often present in raw materials utilized to form glass compositions, and as a result may be detectable in the glass compositions described herein even when not actively added to the glass batch.

In embodiments, the glass composition may be substantially free or free of $ZrO_2$. The inclusion of $ZrO_2$ in the glass composition may result in the formation of undesirable zirconia inclusions in the glass, due at least in part to the low solubility of $ZrO_2$ in the glass. While the inclusion of $ZrO_2$ in the glass may increase the fracture toughness, there are cost and supply constraints as well as the previously described devitrification issues that may make using these components undesirable for commercial purposes. Stated differently, the ability of the glass compositions described herein to achieve high fracture toughness values within the inclusion of $ZrO_2$ provides a cost and manufacturability advantage.

In embodiments, the glass composition may be substantially free or free of at least one of $Ta_2O_5$, $HfO_2$, $La_2O_3$, and $Y_2O_3$. In embodiments, the glass composition may be substantially free or free of $Ta_2O_5$, $HfO_2$, $La_2O_3$, and $Y_2O_3$. While these components may increase the fracture toughness of the glass when included, there are cost and supply constraints that make using these components undesirable for commercial purposes. Stated differently, the ability of the glass compositions described herein to achieve high fracture toughness values within the inclusion of $Ta_2O_5$, $HfO_2$, $La_2O_3$, and $Y_2O_3$ provides a cost and manufacturability advantage.

The glass compositions described herein may be described in terms of a lithium to sodium molar ratio ($Li_2O/Na_2O$). A high $Li_2O/Na_2O$ molar ratio allows a deep depth of compression (DOC) to be achieved when the glass compositions are ion exchanged. The increased DOC capability attributable to the high $Li_2O/Na_2O$ molar ratios allows the ion exchanged articles formed from the glass compositions to exhibit improved drop performance, especially on rough surfaces. In embodiments, the glass composition is characterized by a $Li_2O/Na_2O$ molar ratio from greater than or equal to 1.2 to less than or equal to 2.0, such as greater than or equal to 1.3 to less than or equal to 1.9, greater than or equal to 1.4 to less than or equal to 1.8, greater than or equal to 1.5 to less than or equal to 1.7, greater than or equal to 1.6 to less than or equal to 2.0, and all ranges and sub-ranges between the foregoing values.

Physical properties of the glass compositions as disclosed above will now be discussed.

Glass compositions according to embodiments have a high fracture toughness. Without wishing to be bound by any particular theory, the high fracture toughness may impart improved drop performance to the glass compositions. The high fracture toughness of the glass compositions described herein increases the resistance of the glasses to damage and allows a higher degree of stress to be imparted to the glass through ion exchange, as characterized by central tension, without becoming frangible. As utilized herein, the fracture toughness refers to the $K_{IC}$ value as measured by the chevron notched short bar method unless otherwise noted. The chevron notched short bar (CNSB) method utilized to measure the $K_{IC}$ value is disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988) except that $Y^*_m$ is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992). Additionally, the $K_{IC}$ values are measured on non-strengthened glass samples, such as measuring the $K_{IC}$ value prior to ion exchanging a glass-based substrate to form a glass-based article. The Kw values discussed herein are reported in MPa√m, unless otherwise noted.

In embodiments, the glass compositions exhibit a $K_{IC}$ value of greater than or equal to 0.75 MPa√m, such as greater than or equal to 0.76 MPa√m, greater than or equal to 0.77 MPa√m, greater than or equal to 0.8 MPa√m, or more. In embodiments, the glass compositions exhibit a $K_{IC}$ value of from greater than or equal to 0.75 MPa√m to less than or equal to 0.8 MPa√m, such as greater than or equal to 0.76 MPa√m to less than or equal to 0.79 MPa√m, greater than or equal to 0.77 to less than or equal to 0.78 MPa√m, and all ranges and sub-ranges between the foregoing values.

The glass compositions described herein have liquidus viscosities that are compatible with manufacturing processes that are especially suitable for forming thin glass sheets. For example, the glass compositions are compatible with down draw processes such as fusion draw processes or slot draw processes. Embodiments of the glass-based substrates may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass-based article. The fusion of the glass films produces a fusion line within the glass-based substrate, and this fusion line allows glass-based substrates that were fusion formed to be identified without additional knowledge of the manufacturing history. The fusion draw method offers the advantage that, because the two glass films flowing over the channel fuse together, neither of the outside surfaces of the resulting glass-based article comes in contact with any part of the apparatus. Thus, the surface properties of the fusion drawn glass-based article are not affected by such contact.

The glass compositions described herein may be selected to have liquidus viscosities that are compatible with fusion draw processes. Thus, the glass compositions described herein are compatible with existing forming methods, increasing the manufacturability of glass-based articles formed from the glass compositions. As used herein, the term "liquidus viscosity" refers to the viscosity of a molten glass at the liquidus temperature, wherein the liquidus temperature refers to the temperature at which crystals first appear as a molten glass cools down from the melting temperature, or the temperature at which the very last crystals melt away as temperature is increased from room temperature. Unless specified otherwise, a liquidus viscosity value disclosed in this application is determined by the following method. First, the liquidus temperature of the glass is measured in accordance with ASTM C829-81 (2015), titled "Standard Practice for Measurement of Liquidus Temperature of Glass by the Gradient Furnace Method." Next, the viscosity of the glass at the liquidus temperature is measured in accordance with ASTM C965-96 (2012), titled "Standard Practice for Measuring Viscosity of Glass Above the Softening Point". The term "Vogel-Fulcher-Tamman ('VFT') relation," as used herein, described the temperature dependence of the viscosity and is represented by the following equation:

$$\log \eta = A + \frac{B}{T - T_o}$$

where η is viscosity. To determine VFT A, VFT B, and VFT $T_o$, the viscosity of the glass composition is measured over a given temperature range. The raw data of viscosity versus temperature is then fit with the VFT equation by least-squares fitting to obtain A, B, and $T_o$. With these values, a viscosity point (e.g., 200 P Temperature, 35000 P Temperature, and 200000 P Temperature) at any temperature above softening point may be calculated. Unless otherwise specified, the liquidus viscosity and temperature of a glass composition or article is measured before the composition or article is subjected to any ion-exchange process or any other strengthening process. In particular, the liquidus viscosity and temperature of a glass composition or article is measured before the composition or article is exposed to an ion-exchange solution, for example before being immersed in an ion-exchange solution.

In embodiments, the liquidus viscosity of the glass composition may be greater than or equal to 50 kP, such as greater than or equal to 55 kP, greater than or equal to 60 kP, greater than or equal to 65 kP, greater than or equal to 70 kP, greater than or equal to 75 kP, or more. In embodiments, the liquidus viscosity of the glass composition may be greater than or equal to 50 kP to less than or equal to 80 kP, such as greater than or equal to 55 kP to less than or equal to 75 kP, greater than or equal to 60 kP to less than or equal to 70 kP, greater than or equal to 50 kP to less than or equal to 65 kP, greater than or equal to 50 kP to less than or equal to 75 kP, and all ranges and sub-ranges between the foregoing values. A lower liquidus viscosity has been associated with higher $K_{IC}$ values and improved ion exchange capability, but when the liquidus viscosity is too low the manufacturability of the glass compositions is reduced.

The glass compositions may be described in terms of the components included therein and the properties exhibited by the glass. In embodiments, the glass includes $SiO_2$, $Al_2O_3$, $Li_2O$, $Na_2O$, $P_2O_5$, and $B_2O_3$, with a $Li_2O/Na_2O$ molar ratio greater than or equal to 1.2 to less than or equal to 2.0, has a liquidus viscosity in the range from greater than or equal to 50 kP to less than or equal to 75 kP, and has $K_{IC}$ fracture toughness greater than or equal to 0.75 MPa√m.

In one or more embodiments, the glass compositions described herein may form glass-based articles that exhibit an amorphous microstructure and may be substantially free of crystals or crystallites. In other words, the glass-based articles formed from the glass compositions described herein may exclude glass-ceramic materials.

As mentioned above, in embodiments, the glass compositions described herein can be strengthened, such as by ion exchange, making a glass-based article that is damage resistant for applications such as, but not limited to, display covers. With reference to FIG. 1, a glass-based article is depicted that has a first region under compressive stress (e.g., first and second compressive layers 120, 122 in FIG. 1) extending from the surface to a depth of compression (DOC) of the glass-based article and a second region (e.g., central region 130 in FIG. 1) under a tensile stress or central tension (CT) extending from the DOC into the central or interior region of the glass-based article. As used herein, DOC refers to the depth at which the stress within the glass-based article changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, CS=|CS|. The compressive stress (CS) has a maximum at or near the surface of the glass-based article, and the CS varies with distance d from the surface according to a function. Referring again to FIG. 1, a first segment 120 extends from first surface 110 to a depth $d_1$ and a second segment 122 extends from second surface 112 to a depth $d_2$. Together, these segments define a compression or CS of glass-based article 100. Compressive stress (including surface CS) may be measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

In embodiments, the CS of the glass-based articles is from greater than or equal to 500 MPa to less than or equal to 1500 MPa, such as greater than or equal to 550 MPa to less than or equal to 1500 MPa, greater than or equal to 600 MPa to less than or equal to 1500 MPa, greater than or equal to 650 MPa to less than or equal to 1450 MPa, greater than or equal to 700 MPa to less than or equal to 1400 MPa, greater than or equal to 750 MPa to less than or equal to 1350 MPa, greater than or equal to 800 MPa to less than or equal to 1300 MPa, greater than or equal to 850 MPa to less than or equal to 1250 MPa, greater than or equal to 900 MPa to less than or equal to 1200 MPa, greater than or equal to 950 MPa to less than or equal to 1150 MPa, greater than or equal to 1000 MPa to less than or equal to 1150 MPa, greater than or equal to 1050 MPa to less than or equal to 1500 MPa, greater than or equal to 1200 MPa to less than or equal to 1300 MPa, and all ranges and sub-ranges between the foregoing values.

In embodiments, $Na^+$ and $K^+$ ions are exchanged into the glass-based article and the $Na^+$ ions diffuse to a deeper depth into the glass-based article than the $K^+$ ions. The depth of penetration of $K^+$ ions ("Potassium DOL") is distinguished from DOC because it represents the depth of potassium penetration as a result of an ion exchange process. The Potassium DOL is typically less than the DOC for the articles described herein. Potassium DOL is measured using a surface stress meter such as the commercially available FSM-6000 surface stress meter, manufactured by Orihara Industrial Co., Ltd. (Japan), which relies on accurate measurement of the stress optical coefficient (SOC), as described above with reference to the CS measurement. The potassium DOL may define a depth of a compressive stress spike (DOL$_{SP}$), where a stress profile transitions from a steep spike region to a less-steep deep region. The deep region extends from the bottom of the spike to the depth of compression. The DOL$_{SP}$ of the glass-based articles may be from greater than or equal to 3 μm to less than or equal to 10 μm, such as greater than or equal to 4 μm to less than or equal to 9 μm, greater than or equal to 5 μm to less than or equal to 8 μm, greater than or equal to 6 μm to less than or equal to 7 μm, and all ranges and sub-ranges between the foregoing values.

The compressive stress of both major surfaces (110, 112 in FIG. 1) is balanced by stored tension in the central region (130) of the glass-based article. The maximum central tension (CT) and DOC values may be measured using a scattered light polariscope (SCALP) technique known in the art. The refracted near-field (RNF) method or SCALP may be used to determine the stress profile of the glass-based articles. When the RNF method is utilized to measure the stress profile, the maximum CT value provided by SCALP is utilized in the RNF method. In particular, the stress profile determined by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass-based article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

The measurement of a maximum CT value is an indicator of the total amount of stress stored in the strengthened articles, due to the force balancing described above. For this reason, the ability to achieve higher CT values correlates to the ability to achieve higher degrees of strengthening and increased performance. In embodiments, the glass-based articles may have a maximum CT greater than or equal to 60 MPa, such as greater than or equal to 70 MPa, greater than or equal to 80 MPa, greater than or equal to 90 MPa, greater than or equal to 100 MPa, greater than or equal to 110 MPa, greater than or equal to 120 MPa, greater than or equal to 130 MPa, greater than or equal to 140 MPa, greater than or equal to 150 MPa, or more. In embodiments, the glass-based article may have a maximum CT of from greater than or equal to 60 MPa to less than or equal to 160 MPa, such as greater than or equal to 70 MPa to less than or equal to 160 MPa, greater than or equal to 80 MPa to less than or equal to 160 MPa, greater than or equal to 90 MPa to less than or equal to 160 MPa, greater than or equal to 100 MPa to less than or equal to 150 MPa, greater than or equal to 110 MPa to less than or equal to 140 MPa, greater than or equal to 120 MPa to less than or equal to 130 MPa, and all ranges and sub-ranges between the foregoing values.

The high fracture toughness values of the glass compositions described herein also may enable improved performance. The frangibility limit of the glass-based articles produced utilizing the glass compositions described herein is dependent at least in part on the fracture toughness. For this reason, the high fracture toughness of the glass compositions described herein allows for a large amount of stored strain energy to be imparted to the glass-based articles formed therefrom without becoming frangible. The increased amount of stored strain energy that may then be included in the glass-based articles allows the glass-based articles to exhibit increased fracture resistance, which may be observed through the drop performance of the glass-based articles. The relationship between the frangibility limit and the fracture toughness is described in U.S. Patent Application Pub. No. 2020/0079689 A1, titled "Glass-based Articles with Improved Fracture Resistance," published Mar. 12, 2020, the entirety of which is incorporated herein by reference. The relationship between the fracture toughness and drop performance is described in U.S. Patent Application Pub. No. 2019/0369672 A1, titled "Glass with Improved Drop Performance," published Dec. 5, 2019, the entirety of which is incorporated herein by reference.

As noted above, DOC is measured using a scattered light polariscope (SCALP) technique known in the art. The DOC is provided in some embodiments herein as a portion of the thickness (t) of the glass-based article. In embodiments, the glass-based articles may have a depth of compression (DOC) from greater than or equal to 0.20t to less than or equal to 0.25t, such as from greater than or equal to 0.21t to less than or equal to 0.24t, or from greater than or equal to 0.22t to less than or equal to 0.23t, and all ranges and sub-ranges between the foregoing values. The high DOC values produced when the glass compositions described herein are ion exchanged provide improved resistance to fracture, especially for situations where deep flaws may be introduced. For example, the deep DOC provides improved resistance to fracture when dropped on rough surfaces.

Thickness (t) of glass-based article 100 is measured between surface 110 and surface 112. In embodiments, the thickness of glass-based article 100 may be in a range from greater than or equal to 0.1 mm to less than or equal to 4 mm, such as greater than or equal to 0.2 mm to less than or equal to 3.5 mm, greater than or equal to 0.3 mm to less than or equal to 3 mm, greater than or equal to 0.4 mm to less than or equal to 2.5 mm, greater than or equal to 0.5 mm to less than or equal to 2 mm, greater than or equal to 0.6 mm to less than or equal to 1.5 mm, greater than or equal to 0.7 mm to less than or equal to 1 mm, greater than or equal to 0.2 mm to less than or equal to 2 mm, and all ranges and sub-ranges between the foregoing values. The glass substrate utilized to form the glass-based article may have the same thickness as the thickness desired for the glass-based article.

Compressive stress layers may be formed in the glass by exposing the glass to an ion exchange medium. In embodiments, the ion exchange medium may be molten nitrate salt. In embodiments, the ion exchange medium may be a molten salt bath, and may include $KNO_3$, $NaNO_3$, or combinations thereof. In embodiments, other sodium and potassium salts may be used in the ion exchange medium, such as, for example sodium or potassium nitrites, phosphates, or sulfates. In embodiments, the ion exchange medium may include lithium salts, such as $LiNO_3$. The ion exchange medium may additionally include additives commonly included when ion exchanging glass, such as silicic acid.

The ion exchange process is applied to a glass-based substrate to form a glass-based article that includes a compressive stress layer extending from a surface of the glass-based article to a depth of compression and a central tension region. The glass-based substrate utilized in the ion exchange process may include any of the glass compositions described herein.

In embodiments, the ion exchange medium comprises $NaNO_3$. The sodium in the ion exchange medium exchanges with lithium ions in the glass to produce a compressive stress. In embodiments, the ion exchange medium may include $NaNO_3$ in an amount of less than or equal to 95 wt %, such as less than or equal to 90 wt %, less than or equal to 80 wt %, less than or equal to 70 wt %, less than or equal to 60 wt %, less than or equal to 50 wt %, less than or equal to 40 wt %, less than or equal to 30 wt %, less than or equal to 20 wt %, less than or equal to 10 wt %, or less. In embodiments, the ion exchange medium may include $NaNO_3$ in an amount of greater than or equal to 5 wt %, such as greater than or equal to 10 wt %, greater than or equal to 20 wt %, greater than or equal to 30 wt %, greater than or equal to 40 wt %, greater than or equal to 50 wt %, greater than or equal to 60 wt %, greater than or equal to 70 wt %, greater than or equal to 80 wt %, greater than or equal to 90 wt %, or more. In embodiments, the ion exchange medium may include $NaNO_3$ in an amount of greater than or equal to 0 wt % to less than or equal to 100 wt %, such as greater than or equal to 10 wt % to less than or equal to 90 wt %, greater than or equal to 20 wt % to less than or equal to 80 wt %, greater than or equal to 30 wt % to less than or equal to 70 wt %, greater than or equal to 40 wt % to less than or equal to 60 wt %, greater than or equal to 50 wt % to less than or equal to 90 wt %, and all ranges and sub-ranges between the foregoing values. In embodiments, the molten ion exchange medium includes 100 wt % $NaNO_3$.

In embodiments, the ion exchange medium comprises $KNO_3$. In embodiments, the ion exchange medium may include $KNO_3$ in an amount of less than or equal to 95 wt %, such as less than or equal to 90 wt %, less than or equal to 80 wt %, less than or equal to 70 wt %, less than or equal to 60 wt %, less than or equal to 50 wt %, less than or equal to 40 wt %, less than or equal to 30 wt %, less than or equal to 20 wt %, less than or equal to 10 wt %, or less. In embodiments, the ion exchange medium may include $KNO_3$ in an amount of greater than or equal to 5 wt %, such as greater than or equal to 10 wt %, greater than or equal to 20 wt %, greater than or equal to 30 wt %, greater than or equal to 40 wt %, greater than or equal to 50 wt %, greater than or equal to 60 wt %, greater than or equal to 70 wt %, greater than or equal to 80 wt %, greater than or equal to 90 wt %, or more. In embodiments, the ion exchange medium may include $KNO_3$ in an amount of greater than or equal to 0 wt % to less than or equal to 100 wt %, such as greater than or equal to 10 wt % to less than or equal to 90 wt %, greater than or equal to 20 wt % to less than or equal to 80 wt %, greater than or equal to 30 wt % to less than or equal to 70 wt %, greater than or equal to 40 wt % to less than or equal to 60 wt %, greater than or equal to 50 wt % to less than or equal to 90 wt %, and all ranges and sub-ranges between the foregoing values. In embodiments, the molten ion exchange medium includes 100 wt % $KNO_3$.

The ion exchange medium may include a mixture of sodium and potassium. In embodiments, the ion exchange medium is a mixture of potassium and sodium, such as a molten salt bath that includes both $NaNO_3$ and $KNO_3$. In embodiments, the ion exchange medium may include any combination $NaNO_3$ and $KNO_3$ in the amounts described above, such as a molten salt bath containing 80 wt % $NaNO_3$ and 20 wt % $KNO_3$.

The glass composition may be exposed to the ion exchange medium by dipping a glass substrate made from the glass composition into a bath of the ion exchange medium, spraying the ion exchange medium onto a glass substrate made from the glass composition, or otherwise physically applying the ion exchange medium to a glass substrate made from the glass composition to form the ion exchanged glass-based article. Upon exposure to the glass composition, the ion exchange medium may, according to embodiments, be at a temperature from greater than or equal to 360° C. to less than or equal to 500° C., such as greater than or equal to 370° C. to less than or equal to 490° C., greater than or equal to 380° C. to less than or equal to 480° C., greater than or equal to 390° C. to less than or equal to 470° C., greater than or equal to 400° C. to less than or equal to 460° C., greater than or equal to 410° C. to less than or equal to 450° C., greater than or equal to 420° C. to less than or equal to 440° C., greater than or equal to 430° C. to less than or equal to 470° C., greater than or equal to 400° C. to less than or equal to 470° C., greater than or equal to 380° C. to less than or equal to 470° C., and all ranges and sub-ranges between the foregoing values. In embodiments, the glass composition may be exposed to the ion exchange medium for a duration from greater than or equal to 10 minutes to less than or equal to 48 hours, such as greater than or equal to 10 minutes to less than or equal to 24 hours, greater than or equal to 0.5 hours to less than or equal to 24 hours, greater than or equal to 1 hours to less than or equal to 18 hours, greater than or equal to 2 hours to less than or equal to 12 hours, greater than or equal to 4 hours to less than or equal to 8 hours, and all ranges and sub-ranges between the foregoing values.

The ion exchange process may include a second ion exchange treatment. In embodiments, the second ion exchange treatment may include ion exchanging the glass-based article in a second molten salt bath. The second ion exchange treatment may utilize any of the ion exchange mediums described herein. In embodiments, the second ion exchange treatment utilizes a second molten salt bath that includes $KNO_3$.

The ion exchange process may be performed in an ion exchange medium under processing conditions that provide an improved compressive stress profile as disclosed, for example, in U.S. Patent Application Publication No. 2016/0102011, which is incorporated herein by reference in its entirety. In some embodiments, the ion exchange process may be selected to form a parabolic stress profile in the glass-based articles, such as those stress profiles described in U.S. Patent Application Publication No. 2016/0102014, which is incorporated herein by reference in its entirety.

After an ion exchange process is performed, it should be understood that a composition at the surface of an ion exchanged glass-based article is be different than the composition of the as-formed glass substrate (i.e., the glass substrate before it undergoes an ion exchange process). This results from one type of alkali metal ion in the as-formed glass substrate, such as, for example $Li^+$ or $Na^+$, being replaced with larger alkali metal ions, such as, for example $Na^+$ or $K^+$, respectively. However, the glass composition at or near the center of the depth of the glass-based article will, in embodiments, still have the composition of the as-formed non-ion exchanged glass substrate utilized to form the glass-based article. As utilized herein, the center of the glass-based article refers to any location in the glass-based article that is a distance of at least 0.5t from every surface thereof, where t is the thickness of the glass-based article.

Figure 2A:
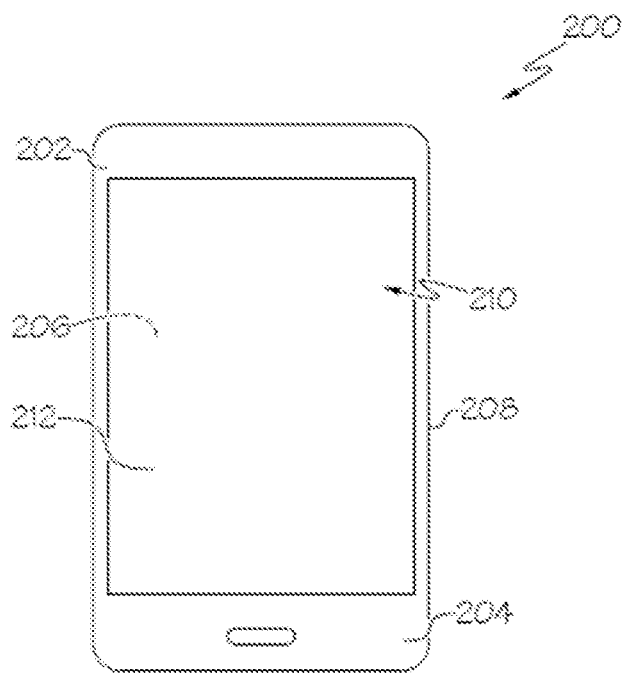
FIG. 2A is a plan view of an exemplary electronic device incorporating any of the glass-based articles disclosed herein.
Figure 2B:
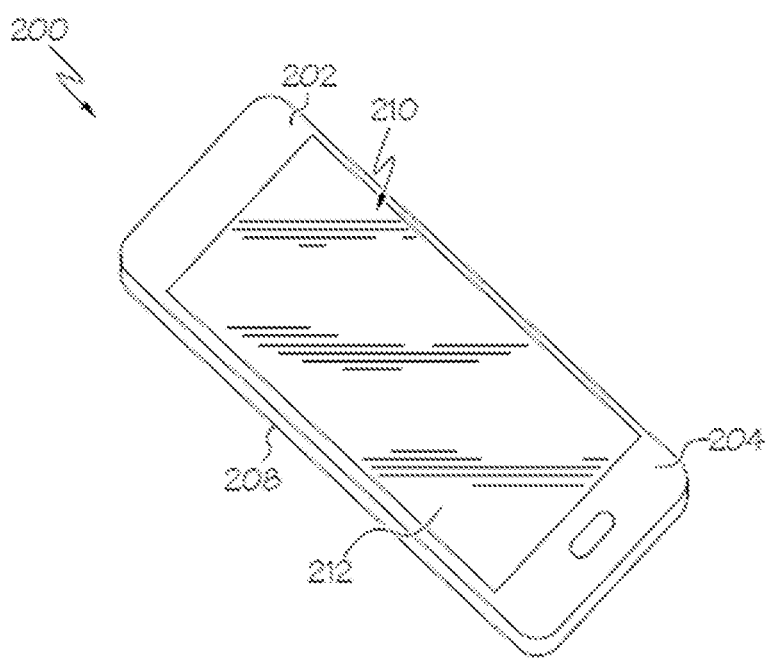
FIG. 2B is a perspective view of the exemplary electronic device of FIG. 2A.

The glass-based articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass-based articles disclosed herein is shown in FIGS. 2A and 2B. Specifically, FIGS. 2A and 2B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover 212 at or over the front surface of the housing such that it is over the display. In embodiments, at least a portion of at least one of the cover 212 and the housing 202 may include any of the glass-based articles described herein.

Examples

Embodiments will be further clarified by the following examples. It should be understood that these examples are not limiting to the embodiments described above.

Glass compositions were prepared and analyzed. The analyzed glass compositions included the components listed in Table I below and were prepared by conventional glass forming methods. In Table I, all components are in mol %, and the $K_{IC}$ fracture toughness was measured primarily with the chevron notch (CNSB) method described herein. The Poisson's ratio (v), the Young's modulus (E), and the shear modulus (G) of the glass compositions were measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts.". The refractive index at 589.3 nm and stress optical coefficient (SOC) of the substrates are also reported in Table I. The density of the glass compositions was determined using the buoyancy method of ASTM C693-93(2013).

Figure 7:
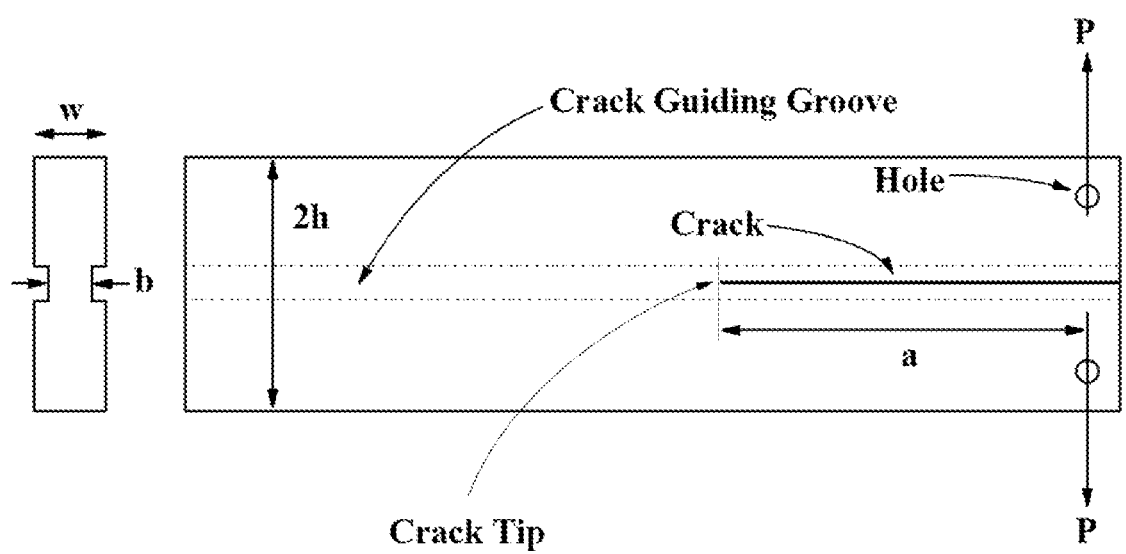
FIG. 7 is a schematic representation of a sample utilized in the double cantilever beam (DCB) procedure to determine the fracture toughness $K_{IC}$ and a cross-section thereof.

Alternative $K_{IC}$ fracture toughness measurements were performed on some samples with the double cantilever beam (DCB) procedure and are also reported in Table I. The DCB specimen geometry is shown in FIG. 7 with parameters being the crack length a, applied load P, cross-sectional dimensions w and 2h, and the thickness of the crack-guiding groove b. The samples were cut into rectangles of width 2h=1.25 cm and a thickness ranging from, w=0.3 mm to 1 mm, with the overall length of the sample, which is not a critical dimension, varying from 5 cm to 10 cm. A hole was drilled on both ends with a diamond drill to provide a means of attaching the sample to a sample holder and to the load. A crack "guiding groove" was cut down the length of the sample on both flat faces using a wafer dicing saw with a diamond blade, leaving a "web" of material, approximately half the total plate thickness (dimension b in FIG. 7), with a height of 180 μm corresponding to the blade thickness. The high precision dimensional tolerances of the dicing saw allow for minimal sample-to-sample variation. The dicing saw was also used to cut an initial crack where a=15 mm. As a consequence of this final operation a very thin wedge of material was created near the crack tip (due to the blade curvature) allowing for easier crack initiation in the sample. The samples were mounted in a metal sample holder with a steel wire in the bottom hole of the sample. The samples were also supported on the opposite end to keep the samples level under low loading conditions. A spring in series with a load cell (FUTEK, LSB200) was hooked to the upper hole which was then extended, to gradually apply load, using rope and a high precision slide. The crack was monitored using a microscope having a 5 μm resolution attached to a digital camera and a computer. The applied stress intensity, $K_P$, was calculated using the following equation:

$$K_P = \left[\frac{P \cdot a}{(w \cdot b)^{0.5} h^{1.5}}\right]\left[3.47 + 2.32\frac{h}{a}\right]$$

For each sample, a crack was first initiated at the tip of the web, and then the starter crack was carefully sub-critically grown until the ratio of dimensions a/h was greater than 1.5 to accurately calculate stress intensity. At this point the crack length, a, was measured and recorded using a traveling microscope with 5 μm resolution. A drop of toluene was then placed into the crack groove and wicked along the length of the groove by capillary forces, pinning the crack from moving until the fracture toughness is reached. The load was then increased until sample fracture occurred, and the critical stress intensity $K_{IC}$ calculated from the failure load and sample dimensions, with $K_P$ being equivalent to $K_{IC}$ due to the measurement method.

The term "annealing point," as used herein, refers to the temperature at which the viscosity of the glass composition is $1 \times 10^{13.18}$ poise. The term "strain point," as used herein, refers to the temperature at which the viscosity of the glass composition is $1 \times 10^{14.68}$ poise. The strain point and annealing point of the glass compositions was determined using the fiber elongation method of ASTM C336-71(2015) or the beam bending viscosity (BBV) method of ASTM C598-93 (2013).

The term "softening point," as used herein, refers to the temperature at which the viscosity of the glass composition is $1 \times 10^{7.6}$ poise. The softening point of the glass compositions was determined using the fiber elongation method of ASTM C336-71(2015) or a parallel plate viscosity (PPV) method which measures the viscosity of inorganic glass from $10^7$ to $10^9$ poise as a function of temperature, similar to ASTM C1351M.

The linear coefficient of thermal expansion (CTE) over the temperature range 0-300° C. is expressed in terms of ppm/° C. and was determined using a push-rod dilatometer in accordance with ASTM E228-11.

TABLE I

| Composition | 1 | 2 | 3 | 4 | 5 |
|---|---|---|---|---|---|
| $SiO_2$ | 62.09 | 62.34 | 63.15 | 63.03 | 63.06 |
| $Al_2O_3$ | 15.74 | 15.77 | 15.71 | 15.72 | 15.72 |
| $P_2O_5$ | 0.85 | 0.86 | 0.86 | 0.86 | 0.86 |

TABLE I-continued

|  |  | | | | | |
|---|---|---|---|---|---|---|
|  | $B_2O_3$ | 5.59 | 5.34 | 4.51 | 4.58 | 4.55 |
|  | MgO | 0.56 | 0.57 | 0.56 | 0.28 | 0.29 |
|  | CaO | 1.42 | 1.45 | 1.45 | 1.75 | 1.47 |
|  | SrO | 1.12 | 1.13 | 1.12 | 1.13 | 1.44 |
|  | ZnO | 0.00 | 0.00 | 0.00 | 0.00 | 0.00 |
|  | $Li_2O$ | 7.44 | 7.34 | 7.42 | 7.44 | 7.40 |
|  | $Na_2O$ | 4.77 | 4.79 | 4.78 | 4.78 | 4.77 |
|  | $K_2O$ | 0.22 | 0.22 | 0.22 | 0.22 | 0.22 |
|  | $TiO_2$ | 0.17 | 0.17 | 0.17 | 0.17 | 0.17 |
|  | $SnO_2$ | 0.05 | 0.05 | 0.05 | 0.05 | 0.04 |
|  | $Fe_2O_3$ | 0.00 | 0.00 | 0.00 | 0.00 | 0.00 |
|  | $ZrO_2$ |  |  |  |  |  |
|  | $Li_2O/Na_2O$ | 1.56 | 1.53 | 1.55 | 1.56 | 1.55 |
|  | Density ($g/cm^3$) | 2.41 | 2.41 | 2.414 | 2.415 | 2.42 |
|  | CTE 0-300° C. (ppm/° C.) |  |  |  |  |  |
| Fiber Elongation | Strain Point (° C.) |  |  |  |  |  |
|  | Annealing Point (° C.) |  |  |  |  |  |
|  | Softening Point (° C.) |  |  |  |  |  |
| BBV | Strain Point (° C.) | 549.6 | 556.7 | 560.4 | 562.7 | 563.8 |
|  | Annealing Point (° C.) | 598.8 | 605.6 | 610.5 | 611.5 | 613.1 |
| PPV | Softening Point (° C.) | 832.1 | 836.4 | 848.7 | 847.3 | 847.3 |
|  | Young's Modulus (GPa) | 76.4 | 76.5 | 77.4 | 77.2 | 77.1 |
|  | Shear Modulus (GPa) | 31.3 | 31.2 | 31.7 | 31.7 | 31.6 |
|  | Poisson's ratio | 0.219 | 0.225 | 0.22 | 0.217 | 0.22 |
| CNSB $K_{IC}$ | $K_{IC}$ ($MPa \cdot m^{0.5}$) | 0.745 | 0.713 | 0.755 | 0.73 | 0.77 |
|  | St. Deviation | 0.008 |  | 0.012 | 0.015 | 0.015 |
| DCB $K_{IC}$ | $K_{IC}$ ($MPa \cdot m^{0.5}$) |  |  |  |  |  |
|  | St. Deviation |  |  |  |  |  |
|  | Refractive Index | 1.5121 | 1.5123 | 1.5122 | 1.5124 | 1.5126 |
|  | Stress Optical Coefficient |  |  |  |  |  |
| VFT Parameters | A | −3.332 | −3.254 | −3.411 | −3.212 | −3.153 |
|  | B | 8208.8 | 7933.3 | 8458.5 | 7875.9 | 7878.5 |
|  | $T_o$ | 74.1 | 99.6 | 71.8 | 114.9 | 114.4 |
| Liquidus Temperature (° C.) | Air | 1080 | 1090 | 1115 | 1120 | 1110 |
|  | Internal | 1075 | 1080 | 1100 | 1105 | 1095 |
|  | Platinum | 1065 | 1070 | 1095 | 1095 | 1095 |
|  | Primary Phase | Spodumene | Spodumene | Spodumene | Spodumene | Spodumene |
|  | Secondary Phase | Feldspar | Feldspar | Feldspar | Feldspar | Feldspar |
| Liquidus Viscosity (kP) | Air |  |  |  |  |  |
|  | Internal | 74 | 69 | 65 | 55 | 76 |
|  | Platinum |  |  |  |  |  |

| Composition | 6 | 7 | 8 | 9 | 10 |
|---|---|---|---|---|---|
| $SiO_2$ | 62.56 | 63.33 | 63.79 | 64.42 | 64.24 |
| $Al_2O_3$ | 15.89 | 15.64 | 15.66 | 15.66 | 15.68 |
| $P_2O_5$ | 0.87 | 0.86 | 0.86 | 0.84 | 1.10 |
| $B_2O_3$ | 4.63 | 4.23 | 3.73 | 3.21 | 3.17 |
| MgO | 0.29 | 0.28 | 0.28 | 0.28 | 0.28 |
| CaO | 1.47 | 1.46 | 1.47 | 1.46 | 1.46 |
| SrO | 1.66 | 1.43 | 1.43 | 1.42 | 1.43 |
| ZnO | 0.00 | 0.00 | 0.00 | 0.00 | 0.00 |
| $Li_2O$ | 7.40 | 7.43 | 7.50 | 7.39 | 7.29 |
| $Na_2O$ | 4.79 | 4.90 | 4.85 | 4.88 | 4.89 |
| $K_2O$ | 0.22 | 0.22 | 0.22 | 0.22 | 0.22 |
| $TiO_2$ | 0.17 | 0.16 | 0.17 | 0.16 | 0.17 |
| $SnO_2$ | 0.05 | 0.05 | 0.05 | 0.05 | 0.05 |
| $Fe_2O_3$ | 0.01 | 0.00 | 0.01 | 0.00 | 0.01 |
| $ZrO_2$ |  |  |  |  |  |

TABLE I-continued

| | | | | | | |
|---|---|---|---|---|---|---|
| | Li$_2$O/Na$_2$O | 1.54 | 1.52 | 1.55 | 1.51 | 1.49 |
| | Density (g/cm$^3$) | 2.427 | | | | |
| | CTE 0-300° C. (ppm/° C.) | | | | | |
| Fiber Elongation | Strain Point (° C.) | | | | | |
| | Annealing Point (° C.) | | | | | |
| | Softening Point (° C.) | | | | | |
| BBV | Strain Point (° C.) | 562.2 | | | | |
| | Annealing Point (° C.) | 611.3 | | | | |
| PPV | Softening Point (° C.) | 847.9 | | | | |
| | Young's Modulus (GPa) | 77.4 | | | | |
| | Shear Modulus (GPa) | 31.7 | | | | |
| | Poisson's ratio | 0.222 | | | | |
| CNSB K$_{IC}$ | K$_{IC}$ (MPa · am$^{0.5}$) | 0.756 | | | | |
| | St. Deviation | 0.018 | | | | |
| DCB K$_{IC}$ | K$_{IC}$ (MPa · m$^{0.5}$) | | | | | |
| | St. Deviation | | | | | |
| | Refractive Index | 1.5135 | | | | |
| | Stress Optical Coefficient | | | | | |
| VFT Parameters | A | −3.326 | −3.285 | −3.138 | −3.288 | −3.616 |
| | B | 8221.9 | 8208.8 | 7929.5 | 8243.8 | 9096 |
| | T$_o$ | 86.6 | 95.2 | 123 | 110.2 | 44.4 |
| Liquidus Temperature (° C.) | Air | 1125 | 1115 | 1125 | 1135 | 1135 |
| | Internal | 1105 | 1110 | 1115 | 1125 | 1125 |
| | Platinum | 1105 | 1095 | 1110 | 1115 | 1120 |
| | Primary Phase | Feldspar | Spodumene | Spodumene | Spodumene | Spodumene |
| | Secondary Phase | Spodumene | Feldspar | Feldspar | Feldspar | Feldspar |
| Liquidus Viscosity (kP) | Air | | | | | |
| | Internal | 56 | 64 | 72 | 68 | 63 |
| | Platinum | | | | | |

| Composition | 11 | 12 | 13 | 14 | 15 |
|---|---|---|---|---|---|
| SiO$_2$ | 64.35 | 64.05 | 64.11 | 64.25 | 64.11 |
| Al$_2$O$_3$ | 15.69 | 15.65 | 15.60 | 15.61 | 15.63 |
| P$_2$O$_5$ | 1.11 | 1.11 | 1.09 | 1.05 | 1.05 |
| B$_2$O$_3$ | 3.19 | 3.25 | 3.01 | 3.04 | 2.96 |
| MgO | 0.28 | 0.53 | 0.52 | 0.52 | 0.52 |
| CaO | 1.46 | 1.72 | 1.72 | 1.68 | 1.70 |
| SrO | 1.68 | 1.43 | 1.64 | 1.42 | 1.62 |
| ZnO | 0.00 | 0.00 | 0.00 | 0.00 | 0.00 |
| Li$_2$O | 7.38 | 7.41 | 7.41 | 7.59 | 7.57 |
| Na$_2$O | 4.42 | 4.41 | 4.44 | 4.41 | 4.41 |
| K$_2$O | 0.23 | 0.23 | 0.23 | 0.22 | 0.22 |
| TiO$_2$ | 0.16 | 0.17 | 0.16 | 0.16 | 0.16 |
| SnO$_2$ | 0.05 | 0.05 | 0.05 | 0.04 | 0.04 |
| Fe$_2$O$_3$ | 0.01 | 0.00 | 0.01 | 0.00 | 0.00 |
| ZrO$_2$ | | | | | |
| Li$_2$O/Na$_2$O | 1.67 | 1.68 | 1.67 | 1.72 | 1.72 |
| Density (g/cm$^3$) | | 2.428 | 2.435 | 2.43 | 2.436 |
| CTE 0-300° C. (ppm/° C.) | | 58.5 | 59.4 | 60 | 60.2 |
| Fiber Elongation Strain Point (° C.) | | 585 | 580 | 581 | 584 |
| Annealing Point (° C.) | | 635 | 630 | 631 | 633 |
| Softening Point (° C.) | | 875.2 | 870.2 | 869.5 | 867.9 |

TABLE I-continued

| | | | | | | |
|---|---|---|---|---|---|---|
| BBV | Strain Point (° C.) | | | | | |
| | Annealing Point (° C.) | | | | | |
| PPV | Softening Point (° C.) | | | | | |
| | Young's Modulus (GPa) | | | | | |
| | Shear Modulus (GPa) | | | | | |
| | Poisson's ratio | | | | | |
| CNSB $K_{IC}$ | $K_{IC}$ (MPa · m$^{0.5}$) | | | | | |
| | St. Deviation | | | | | |
| DCB $K_{IC}$ | $K_{IC}$ (MPa · m$^{0.5}$) | | | | | |
| | St. Deviation | | | | | |
| Refractive Index | | | | 1.5135 | 1.5134 | 1.5142 |
| Stress Optical Coefficient | | | | 3.013 | 3.023 | 3.006 |
| VFT Parameters | A | −3.28 | −2.788 | −3.213 | −3.223 | −3.266 |
| | B | 8195.8 | 7164.1 | 8088.1 | 8097.4 | 8291.6 |
| | $T_o$ | 111 | 181.9 | 110.4 | 108.1 | 88.7 |
| Liquidus Temperature (° C.) | Air | 1140 | 1125 | 1140 | 1165 | 1145 |
| | Internal | 1130 | 1115 | 1130 | 1155 | 1140 |
| | Platinum | 1115 | 1110 | 1120 | 1145 | 1135 |
| | Primary Phase | Spodumene | Spodumene | Spodumene | Spodumene | Spodumene |
| | Secondary Phase | Feldspar | Feldspar | Anorthoclase | Anorthoclase | Anorthoclase |
| Liquidus Viscosity (kP) | Air | | | | | |
| | Internal | 58 | 78 | 52 | 32 | 42 |
| | Platinum | | | | | |

| Composition | | 16 | 17 | 18 | 19 | 20 |
|---|---|---|---|---|---|---|
| | $SiO_2$ | 64.09 | 63.75 | 63.50 | 64.78 | 64.05 |
| | $Al_2O_3$ | 15.63 | 15.62 | 15.61 | 15.13 | 15.15 |
| | $P_2O_5$ | 1.06 | 1.09 | 1.09 | 0.99 | 0.98 |
| | $B_2O_3$ | 3.01 | 3.04 | 3.05 | 3.08 | 3.06 |
| | MgO | 0.52 | 0.52 | 0.53 | 0.97 | 0.98 |
| | CaO | 1.70 | 1.72 | 1.72 | 0.02 | 0.02 |
| | SrO | 1.42 | 1.64 | 1.83 | 2.43 | 2.81 |
| | ZnO | 0.00 | 0.00 | 0.00 | 0.00 | 0.00 |
| | $Li_2O$ | 7.74 | 7.76 | 7.79 | 7.08 | 7.44 |
| | $Na_2O$ | 4.41 | 4.43 | 4.45 | 5.07 | 5.07 |
| | $K_2O$ | 0.22 | 0.22 | 0.22 | 0.23 | 0.22 |
| | $TiO_2$ | 0.17 | 0.16 | 0.16 | 0.16 | 0.16 |
| | $SnO_2$ | 0.04 | 0.04 | 0.05 | 0.05 | 0.04 |
| | $Fe_2O_3$ | 0.00 | 0.01 | 0.00 | 0.00 | 0.00 |
| | $ZrO_2$ | | | | | |
| | $Li_2O/Na_2O$ | 1.76 | 1.75 | 1.75 | 1.40 | 1.47 |
| | Density (g/cm$^3$) | 2.43 | 2.436 | 2.442 | 2.438 | 2.453 |
| | CTE 0-300° C. (ppm/° C.) | 60.2 | 60.7 | 61.6 | 60.5 | 62.5 |
| Fiber Elongation | Strain Point (° C.) | 579 | 575 | 572 | 577 | 565 |
| | Annealing Point (° C.) | 629 | 624 | 621 | 627 | 614 |
| | Softening Point (° C.) | 867.2 | 859.3 | 858 | 873.2 | 856.2 |
| BBV | Strain Point (° C.) | | | | | |
| | Annealing Point (° C.) | | | | | |
| PPV | Softening Point (° C.) | | | | | |
| | Young's Modulus (GPa) | | | | | |
| | Shear Modulus (GPa) | | | | | |

TABLE I-continued

|  |  |  |  |  |  |  |
|---|---|---|---|---|---|---|
| Poisson's ratio | | | | | | |
| CNSB | $K_{IC}$ | | | | | |
| $K_{IC}$ | (MPa · m$^{0.5}$) | | | | | |
| | St. Deviation | | | | | |
| DCB | $K_{IC}$ | | | | | |
| $K_{IC}$ | (MPa · m$^{0.5}$) | | | | | |
| | St. Deviation | | | | | |
| Refractive Index | | 1.5139 | 1.5145 | 1.5151 | 1.5113 | 1.514 |
| Stress Optical Coefficient | | 3.021 | 3.018 | 2.99 | 3.051 | 3.027 |
| VFT | A | −3.17 | −2.453 | −3.176 | −3.33 | −3.431 |
| Parameters | B | 7993.7 | 6498.9 | 7965.3 | 8529.3 | 8867 |
| | $T_o$ | 114.5 | 216 | 108.9 | 81.4 | 33.7 |
| Liquidus | Air | 1155 | 1145 | 1140 | 1155 | 1155 |
| Temperature | Internal | 1150 | 1130 | 1135 | 1145 | 1145 |
| (° C.) | Platinum | 1130 | 1120 | 1120 | 1135 | 1145 |
| | Primary Phase | Spodumene | Spodumene | Anorthoclase | Anorthoclase | Anorthoclase |
| | Secondary Phase | Anorthoclase | Anorthoclase | Spodumene | Spodumene | Spodumene |
| Liquidus | Air | | | | | |
| Viscosity | Internal | 35 | 45 | 39 | 49 | 35 |
| (kP) | Platinum | | | | | |

| Composition | | 21 | 22 | 23 | 24 | 25 |
|---|---|---|---|---|---|---|
| $SiO_2$ | | 64.07 | 63.35 | 63.38 | 63.34 | 64.69 |
| $Al_2O_3$ | | 15.14 | 15.15 | 15.17 | 15.16 | 14.76 |
| $P_2O_5$ | | 0.99 | 0.98 | 0.98 | 0.99 | 0.98 |
| $B_2O_3$ | | 3.04 | 3.01 | 2.96 | 3.01 | 2.25 |
| MgO | | 0.98 | 0.97 | 0.98 | 0.97 | 1.94 |
| CaO | | 0.39 | 0.02 | 0.40 | 0.79 | 2.00 |
| SrO | | 2.43 | 3.23 | 2.83 | 2.42 | 0.00 |
| ZnO | | 0.00 | 0.00 | 0.00 | 0.00 | 0.01 |
| $Li_2O$ | | 7.46 | 7.76 | 7.80 | 7.83 | 8.08 |
| $Na_2O$ | | 5.06 | 5.08 | 5.05 | 5.06 | 4.87 |
| $K_2O$ | | 0.22 | 0.23 | 0.22 | 0.22 | 0.20 |
| $TiO_2$ | | 0.16 | 0.16 | 0.16 | 0.16 | 0.16 |
| $SnO_2$ | | 0.04 | 0.04 | 0.05 | 0.04 | 0.05 |
| $Fe_2O_3$ | | 0.00 | 0.00 | 0.00 | 0.00 | 0.01 |
| $ZrO_2$ | | | | | | |
| $Li_2O/Na_2O$ | | 1.47 | 1.53 | 1.54 | 1.55 | 1.66 |
| Density ($g/cm^3$) | | 2.446 | 2.467 | 2.461 | 2.455 | 2.413 |
| CTE 0-300° C. (ppm/° C.) | | 61.9 | 64.4 | 63.7 | 63.6 | 60.4 |
| Fiber Elongation | Strain Point (° C.) | 566 | 554 | 556 | 560 | 571 |
| | Annealing Point (° C.) | 614 | 602 | 603 | 604 | 619 |
| | Softening Point (° C.) | 856.4 | 836.4 | 836.4 | 836.8 | 857.5 |
| BBV | Strain Point (° C.) | | | | | |
| | Annealing Point (° C.) | | | | | |
| PPV | Softening Point (° C.) | | | | | |
| Young's Modulus (GPa) | | | | | | |
| Shear Modulus (GPa) | | | | | | |
| Poisson's ratio | | | | | | |
| CNSB | $K_{IC}$ | | | | | |
| $K_{IC}$ | (MPa · m$^{0.5}$) | | | | | |
| | St. Deviation | | | | | |
| DCB | $K_{IC}$ | | | | | |
| $K_{IC}$ | (MPa · m$^{0.5}$) | | | | | |
| | St. Deviation | | | | | |
| Refractive Index | | 1.5135 | 1.516 | 1.5158 | 1.5157 | 1.5129 |
| Stress Optical Coefficient | | 3.037 | 2.981 | 2.963 | 2.996 | 3.027 |
| VFT | A | −3.384 | −3.227 | −3.351 | −3.195 | −3.402 |
| Parameters | B | 8657.8 | 8303.1 | 8611.2 | 8182 | 8698.3 |
| | $T_o$ | 52.5 | 51.4 | 32.1 | 58.5 | 48.7 |
| Liquidus | Air | 1145 | 1165 | 1170 | 1145 | 1165 |
| Temperature | Internal | 1135 | 1150 | 1155 | 1130 | 1155 |
| (° C.) | Platinum | 1125 | 1140 | 1140 | 1130 | 1150 |

TABLE I-continued

| | | | | | | |
|---|---|---|---|---|---|---|
| | Primary Phase | Anorthoclase | Anorthoclase | Anorthoclase | Anorthoclase | Spodumene |
| | Secondary Phase | Spodumene | Spodumene | Spodumene | Spodumene | |
| Liquidus Viscosity (kP) | Air | | | | | |
| | Internal | 41 | 21 | 21 | 28 | 29 |
| | Platinum | | | | | |

| | Composition | 26 | 27 | 28 | 29 | 30 |
|---|---|---|---|---|---|---|
| | $SiO_2$ | 64.49 | 64.19 | 63.42 | 63.18 | 62.92 |
| | $Al_2O_3$ | 14.76 | 14.75 | 14.77 | 14.76 | 14.78 |
| | $P_2O_5$ | 1.45 | 1.97 | 1.47 | 1.96 | 2.45 |
| | $B_2O_3$ | 1.71 | 1.10 | 1.94 | 1.33 | 0.72 |
| | MgO | 1.93 | 1.95 | 2.92 | 2.91 | 2.91 |
| | CaO | 1.98 | 2.01 | 1.99 | 2.00 | 2.00 |
| | SrO | 0.00 | 0.00 | 0.00 | 0.00 | 0.00 |
| | ZnO | 0.00 | 0.00 | 0.00 | 0.00 | 0.00 |
| | $Li_2O$ | 8.40 | 8.75 | 8.20 | 8.57 | 8.90 |
| | $Na_2O$ | 4.85 | 4.86 | 4.87 | 4.86 | 4.88 |
| | $K_2O$ | 0.20 | 0.20 | 0.20 | 0.20 | 0.20 |
| | $TiO_2$ | 0.16 | 0.17 | 0.16 | 0.16 | 0.17 |
| | $SnO_2$ | 0.05 | 0.05 | 0.05 | 0.05 | 0.06 |
| | $Fe_2O_3$ | 0.01 | 0.01 | 0.01 | 0.01 | 0.01 |
| | $ZrO_2$ | | | | | |
| | $Li_2O/Na_2O$ | 1.73 | 1.80 | 1.68 | 1.76 | 1.82 |
| | Density ($g/cm^3$) | 2.414 | 2.416 | 2.421 | 2.423 | 2.425 |
| | CTE 0-300° C. (ppm/° C.) | 62.6 | 63.2 | 62.6 | 63.1 | 64.9 |
| Fiber Elongation | Strain Point (° C.) | 573 | 574 | 569 | 568 | 575 |
| | Annealing Point (° C.) | 620 | 620 | 615 | 613 | 619 |
| | Softening Point (° C.) | 856.7 | 859.3 | 845.8 | 856.6 | 870 |
| BBV | Strain Point (° C.) | | | | | |
| | Annealing Point (° C.) | | | | | |
| PPV | Softening Point (° C.) | | | | | |
| | Young's Modulus (GPa) | | | | | |
| | Shear Modulus (GPa) | | | | | |
| | Poisson's ratio | | | | | |
| CNSB $K_{IC}$ | $K_{IC}$ ($MPa \cdot m^{0.5}$) | | | | | |
| | St. Deviation | | | | | |
| DCB $K_{IC}$ | $K_{IC}$ ($MPa \cdot m^{0.5}$) | | | | | |
| | St. Deviation | | | | | |
| | Refractive Index | 1.5124 | 1.5122 | 1.514 | 1.5138 | 1.5135 |
| | Stress Optical Coefficient | 3.014 | 2.977 | 3.013 | 2.976 | 2.931 |
| VFT Parameters | A | −2.934 | −3.31 | −3.116 | −2.984 | −3.259 |
| | B | 7655.5 | 8537 | 7883.8 | 7651.2 | 8335.4 |
| | $T_o$ | 121.8 | 58.7 | 91.7 | 107.1 | 56.3 |
| Liquidus Temperature (° C.) | Air | 1170 | 1175 | 1160 | 1160 | 1165 |
| | Internal | 1160 | 1160 | 1145 | 1150 | 1155 |
| | Platinum | 1150 | 1155 | 1140 | 1140 | 1145 |
| | Primary Phase | Spodumene | Spodumene | Spodumene | Spodumene | Spodumene |
| | Secondary Phase | | | | | |
| Liquidus Viscosity (kP) | Air | | | | | |
| | Internal | 28 | 28 | 23 | 23 | 21 |
| | Platinum | | | | | |

| | Composition | 31 | 32 | 33 | 34 | 35 |
|---|---|---|---|---|---|---|
| | $SiO_2$ | 64.16 | 64.91 | 64.88 | 64.80 | 64.71 |
| | $Al_2O_3$ | 15.67 | 15.49 | 15.51 | 15.55 | 15.53 |
| | $P_2O_5$ | 1.06 | 0.83 | 0.84 | 0.85 | 0.85 |
| | $B_2O_3$ | 2.98 | 3.22 | 3.21 | 3.22 | 3.22 |
| | MgO | 0.50 | 0.03 | 0.02 | 0.10 | 0.27 |
| | CaO | 1.70 | 1.41 | 1.43 | 1.45 | 1.45 |
| | SrO | 1.43 | 1.02 | 1.04 | 1.05 | 1.06 |

TABLE I-continued

| | | | | | | |
|---|---|---|---|---|---|---|
| ZnO | | | 0.00 | 0.00 | 0.00 | 0.00 |
| Li$_2$O | | 7.89 | 7.83 | 7.82 | 7.72 | 7.68 |
| Na$_2$O | | 4.20 | 4.79 | 4.78 | 4.80 | 4.78 |
| K$_2$O | | 0.21 | 0.21 | 0.21 | 0.21 | 0.21 |
| TiO$_2$ | | 0.15 | 0.18 | 0.18 | 0.18 | 0.18 |
| SnO$_2$ | | 0.04 | 0.04 | 0.04 | 0.04 | 0.04 |
| Fe$_2$O$_3$ | | 0.01 | 0.02 | 0.02 | 0.02 | 0.02 |
| ZrO$_2$ | | | 0.02 | 0.02 | 0.02 | 0.01 |
| Li$_2$O/Na$_2$O | | 1.88 | 1.63 | 1.64 | 1.61 | 1.61 |
| Density (g/cm$^3$) | | 2.43 | | | | 2.419 |
| CTE 0-300° C. (ppm/° C.) | | 58.4 | | | | 59.2 |
| Fiber Elongation | Strain Point (° C.) | 586 | | | | 578 |
| | Annealing Point (° C.) | 636 | | | | 629 |
| | Softening Point (° C.) | 875.8 | | | | 877.4 |
| BBV | Strain Point (° C.) | 581.2 | | | | 577 |
| | Annealing Point (° C.) | 631.3 | | | | 627.4 |
| PPV | Softening Point (° C.) | 876.3 | | | | 869.4 |
| Young's Modulus (GPa) | | 79.2 | | | | |
| Shear Modulus (GPa) | | 32.5 | | | | |
| Poisson's ratio | | 0.218 | | | | |
| CNSB K$_{IC}$ | K$_{IC}$ (MPa · m$^{0.5}$) | 0.749 | | | | |
| | St. Deviation | 0.015 | | | | |
| DCB K$_{IC}$ | K$_{IC}$ (MPa · m$^{0.5}$) | 0.782 | | | | 0.797 |
| | St. Deviation | 0.011 | | | | 0.018 |
| Refractive Index | | 1.5139 | | | | 1.5118 |
| Stress Optical Coefficient | | 3.04 | | | | 3.027 |
| VFT Parameters | A | −3.227 | −3.319 | −3.154 | −3.294 | −3.332 |
| | B | 8131 | 8469.1 | 8049.5 | 8355.4 | 8408.2 |
| | T$_o$ | 110.9 | 87.1 | 117.6 | 94.1 | 97.4 |
| Liquidus Temperature (° C.) | Air | 1175 | | | | 1130 |
| | Internal | 1160 | | | | 1120 |
| | Platinum | | | | | 1115 |
| | Primary Phase | Spodumene | | | | Spodumene] |
| | Secondary Phase | | | | | |
| Liquidus Viscosity (kP) | Air | 26 | | | | 65 |
| | Internal | 33.4 | | | | 77.7 |
| | Platinum | | | | | 85.3 |

| Composition | 36 | 37 | 38 | 39 | 40 |
|---|---|---|---|---|---|
| SiO$_2$ | 64.72 | 64.80 | 64.78 | 64.81 | 64.80 |
| Al$_2$O$_3$ | 15.52 | 15.53 | 15.53 | 15.52 | 15.54 |
| P$_2$O$_5$ | 0.85 | 0.85 | 0.85 | 0.85 | 0.85 |
| B$_2$O$_3$ | 3.21 | 3.23 | 3.22 | 3.22 | 3.20 |
| MgO | 0.33 | 0.42 | 0.49 | 0.52 | 0.53 |
| CaO | 1.46 | 1.46 | 1.46 | 1.46 | 1.46 |
| SrO | 1.05 | 1.06 | 1.06 | 1.06 | 1.06 |
| ZnO | 0.00 | 0.00 | 0.00 | 0.00 | 0.00 |
| Li$_2$O | 7.60 | 7.41 | 7.36 | 7.30 | 7.30 |
| Na$_2$O | 4.78 | 4.78 | 4.78 | 4.78 | 4.78 |
| K$_2$O | 0.21 | 0.21 | 0.21 | 0.21 | 0.21 |
| TiO$_2$ | 0.18 | 0.18 | 0.18 | 0.18 | 0.18 |
| SnO$_2$ | 0.04 | 0.04 | 0.04 | 0.04 | 0.04 |
| Fe$_2$O$_3$ | 0.02 | 0.02 | 0.02 | 0.02 | 0.02 |
| ZrO$_2$ | 0.01 | 0.01 | 0.01 | 0.01 | 0.01 |
| Li$_2$O/Na$_2$O | 1.59 | 1.55 | 1.54 | 1.53 | 1.53 |
| Density (g/cm$^3$) | | 2.419 | | | |
| CTE 0-300° C. (ppm/° C.) | | 59.4 | | | |

TABLE I-continued

| | | | | | | | |
|---|---|---|---|---|---|---|---|
| Fiber Elongation | Strain Point (° C.) | | 579 | | | | |
| | Annealing Point (° C.) | | 629 | | | | |
| | Softening Point (° C.) | | 879.5 | | | | |
| BBV | Strain Point (° C.) | | | | | | |
| | Annealing Point (° C.) | | | | | | |
| PPV | Softening Point (° C.) | | | | | | |
| Young's Modulus (GPa) | | | | | | | |
| Shear Modulus (GPa) | | | | | | | |
| Poisson's ratio | | | | | | | |
| CNSB $K_{IC}$ | $K_{IC}$ (MPa · m$^{0.5}$) | | | | | | |
| | St. Deviation | | | | | | |
| DCB $K_{IC}$ | $K_{IC}$ (MPa · m$^{0.5}$) | | | | | | |
| | St. Deviation | | | | | | |
| Refractive Index | | | | | | | |
| Stress Optical Coefficient | | | | | | | |
| VFT Parameters | A | −3.296 | −3.318 | −2.734 | −3.35 | −3.285 | |
| | B | 8367.3 | 8481.2 | 6976.8 | 8443.2 | 8281.5 | |
| | $T_o$ | 99.4 | 87 | 208 | 92.5 | 106.7 | |
| Liquidus Temperature (° C.) | Air | | 1145 | | | | |
| | Internal | | 1135 | | | | |
| | Platinum | | 1130 | | | | |
| | Primary Phase | | Spodumene | | | | |
| | Secondary Phase | | | | | | |
| Liquidus Viscosity (kP) | Air | | 50 | | | | |
| | Internal | | 59.5 | | | | |
| | Platinum | | 65.1 | | | | |

| Composition | 41 | 42 | 43 | 44 | 45 |
|---|---|---|---|---|---|
| SiO$_2$ | 64.85 | 64.74 | 64.51 | 64.37 | 64.25 |
| Al$_2$O$_3$ | 15.55 | 15.53 | 15.58 | 15.59 | 15.61 |
| P$_2$O$_5$ | 0.86 | 0.86 | 0.94 | 0.99 | 1.03 |
| B$_2$O$_3$ | 3.22 | 3.21 | 3.22 | 3.22 | 3.22 |
| MgO | 0.54 | 0.55 | 0.55 | 0.55 | 0.55 |
| CaO | 1.46 | 1.46 | 1.57 | 1.61 | 1.66 |
| SrO | 1.07 | 1.07 | 1.20 | 1.26 | 1.33 |
| ZnO | 0.00 | 0.00 | 0.00 | 0.00 | 0.00 |
| Li$_2$O | 7.21 | 7.34 | 7.34 | 7.39 | 7.39 |
| Na$_2$O | 4.78 | 4.78 | 4.63 | 4.55 | 4.49 |
| K$_2$O | 0.21 | 0.21 | 0.22 | 0.22 | 0.22 |
| TiO$_2$ | 0.18 | 0.18 | 0.18 | 0.18 | 0.18 |
| SnO$_2$ | 0.04 | 0.04 | 0.05 | 0.05 | 0.05 |
| Fe$_2$O$_3$ | 0.02 | 0.02 | 0.02 | 0.02 | 0.02 |
| ZrO$_2$ | 0.01 | 0.01 | 0.01 | 0.01 | 0.01 |
| Li$_2$O/Na$_2$O | 1.51 | 1.54 | 1.59 | 1.62 | 1.65 |

| | | 41 | 42 | 43 | 44 | 45 |
|---|---|---|---|---|---|---|
| Density (g/cm$^3$) | | 2.420 | | | | |
| CTE 0-300° C. (ppm/° C.) | | 59.3 | | | | |
| Fiber Elongation | Strain Point (° C.) | 579 | | | | |
| | Annealing Point (° C.) | 630 | | | | |
| | Softening Point (° C.) | 879.5 | | | | |
| BBV | Strain Point (° C.) | 578.2 | | | | |
| | Annealing Point (° C.) | 628.6 | | | | |
| PPV | Softening Point (° C.) | | | | | |

TABLE I-continued

|  |  |  |  |  |  |  |
|---|---|---|---|---|---|---|
| Young's Modulus (GPa) |  |  |  |  |  |  |
| Shear Modulus (GPa) |  |  |  |  |  |  |
| Poisson's ratio |  |  |  |  |  |  |
| CNSB $K_{IC}$ | $K_{IC}$ (MPa · m$^{0.5}$) |  |  |  |  |  |
|  | St. Deviation |  |  |  |  |  |
| DCB $K_{IC}$ | $K_{IC}$ (MPa · m$^{0.5}$) | 0.789 |  |  |  |  |
|  | St. Deviation | 0.007 |  |  |  |  |
| Refractive Index |  | 1.5139 |  |  |  |  |
| Stress Optical Coefficient |  | 3.028 |  |  |  |  |
| VFT Parameters | A | −3.004 | −3.338 | −3.302 | −3.235 | −3.166 |
|  | B | 7691.1 | 8382 | 8300.4 | 8113.1 | 7921.4 |
|  | $T_o$ | 147.4 | 103.6 | 99.8 | 114.5 | 130.4 |
| Liquidus Temperature (° C.) | Air | 1130 |  |  |  |  |
|  | Internal | 1125 |  |  |  |  |
|  | Platinum | 1125 |  |  |  |  |
|  | Primary Phase | Spodumene |  |  |  |  |
|  | Secondary Phase |  |  |  |  |  |
| Liquidus Viscosity (kP) | Air | 67 |  |  |  |  |
|  | Internal | 73 |  |  |  |  |
|  | Platinum | 73 |  |  |  |  |

| Composition | 46 | 47 | 48 | 49 | 50 |
|---|---|---|---|---|---|
| SiO$_2$ | 64.21 | 64.12 | 64.06 | 64.04 | 64.05 |
| Al$_2$O$_3$ | 15.62 | 15.63 | 15.61 | 15.62 | 15.63 |
| P$_2$O$_5$ | 1.05 | 1.07 | 1.08 | 1.09 | 1.10 |
| B$_2$O$_3$ | 3.21 | 3.22 | 3.21 | 3.22 | 3.22 |
| MgO | 0.54 | 0.54 | 0.54 | 0.53 | 0.53 |
| CaO | 1.69 | 1.70 | 1.71 | 1.72 | 1.73 |
| SrO | 1.36 | 1.38 | 1.39 | 1.40 | 1.42 |
| ZnO | 0.00 | 0.00 | 0.00 | 0.00 | 0.00 |
| Li$_2$O | 7.39 | 7.43 | 7.50 | 7.49 | 7.44 |
| Na$_2$O | 4.44 | 4.43 | 4.40 | 4.40 | 4.38 |
| K$_2$O | 0.22 | 0.23 | 0.23 | 0.23 | 0.23 |
| TiO$_2$ | 0.18 | 0.18 | 0.18 | 0.18 | 0.18 |
| SnO$_2$ | 0.05 | 0.05 | 0.06 | 0.05 | 0.06 |
| Fe$_2$O$_3$ | 0.02 | 0.02 | 0.02 | 0.02 | 0.02 |
| ZrO$_2$ | 0.02 | 0.02 | 0.02 | 0.01 | 0.01 |
| Li$_2$O/Na$_2$O | 1.66 | 1.68 | 1.70 | 1.70 | 1.70 |

|  |  |  |  |  |  |  |
|---|---|---|---|---|---|---|
| Density (g/cm$^3$) |  | 2.429 |  |  |  |  |
| CTE 0-300° C. (ppm/° C.) |  | 58.5 |  |  |  |  |
| Fiber Elongation | Strain Point (° C.) | 576 |  |  |  |  |
|  | Annealing Point (° C.) | 626 |  |  |  |  |
|  | Softening Point (° C.) | 872.3 |  |  |  |  |
| BBV | Strain Point (° C.) | 572.2 |  |  |  |  |
|  | Annealing Point (° C.) | 623.1 |  |  |  |  |
| PPV | Softening Point (° C.) | 863.6 |  |  |  |  |
| Young's Modulus (GPa) |  |  |  |  |  |  |
| Shear Modulus (GPa) |  |  |  |  |  |  |
| Poisson's ratio |  |  |  |  |  |  |
| CNSB $K_{IC}$ | $K_{IC}$ (MPa · m$^{0.5}$) |  |  |  |  |  |
|  | St. Deviation |  |  |  |  |  |
| DCB $K_{IC}$ | $K_{IC}$ (MPa · m$^{0.5}$) | 0.802 |  |  |  |  |
|  | St. Deviation | 0.010 |  |  |  |  |
| Refractive Index |  | 1.5133 |  |  |  |  |
| Stress Optical Coefficient |  | 2.996 |  |  |  |  |
| VFT Parameters | A | −3.452 | −3.115 | −3.632 | −3.29 | −3.105 |
|  | B | 8546.4 | 7828.9 | 9025.4 | 8258.3 | 7894.4 |
|  | $T_o$ | 86.1 | 135.8 | 51.1 | 101.9 | 120.5 |

TABLE I-continued

| | | | | | | |
|---|---|---|---|---|---|---|
| Liquidus Temperature (° C.) | Air | 1130 | | | | |
| | Internal | 1125 | | | | |
| | Platinum | 1115 | | | | |
| | Primary Phase | Spodumene | | | | |
| | Secondary Phase | | | | | |
| Liquidus Viscosity (kP) | Air | 54 | | | | |
| | Internal | 59.5 | | | | |
| | Platinum | 71.5 | | | | |

| Composition | | 51 | 52 | 53 | 54 | 55 |
|---|---|---|---|---|---|---|
| $SiO_2$ | | 64.03 | 64.14 | 64.08 | 64.06 | 64.16 |
| $Al_2O_3$ | | 15.63 | 15.66 | 15.64 | 15.65 | 15.66 |
| $P_2O_5$ | | 1.10 | 1.11 | 1.10 | 1.11 | 1.11 |
| $B_2O_3$ | | 3.22 | 3.23 | 3.23 | 3.23 | 3.23 |
| MgO | | 0.53 | 0.53 | 0.53 | 0.53 | 0.51 |
| CaO | | 1.74 | 1.74 | 1.73 | 1.74 | 1.74 |
| SrO | | 1.42 | 1.42 | 1.42 | 1.42 | 1.41 |
| ZnO | | 0.00 | 0.00 | 0.00 | 0.00 | 0.00 |
| $Li_2O$ | | 7.47 | 7.32 | 7.42 | 7.42 | 7.32 |
| $Na_2O$ | | 4.36 | 4.36 | 4.35 | 4.36 | 4.36 |
| $K_2O$ | | 0.23 | 0.23 | 0.23 | 0.23 | 0.23 |
| $TiO_2$ | | 0.18 | 0.17 | 0.17 | 0.18 | 0.18 |
| $SnO_2$ | | 0.05 | 0.05 | 0.05 | 0.05 | 0.05 |
| $Fe_2O_3$ | | 0.02 | 0.02 | 0.02 | 0.02 | 0.02 |
| $ZrO_2$ | | 0.02 | 0.02 | 0.01 | 0.01 | 0.02 |
| $Li_2O/Na_2O$ | | 1.71 | 1.68 | 1.70 | 1.70 | 1.68 |
| Density (g/cm³) | | | | | | |
| CTE 0-300° C. (ppm/° C.) | | | | | | |
| Fiber Elongation | Strain Point (° C.) | | | | | |
| | Annealing Point (° C.) | | | | | |
| | Softening Point (° C.) | | | | | |
| BBV | Strain Point (° C.) | | | | | |
| | Annealing Point (° C.) | | | | | |
| PPV | Softening Point (° C.) | | | | | |
| Young's Modulus (GPa) | | | | | | |
| Shear Modulus (GPa) | | | | | | |
| Poisson's ratio | | | | | | |
| CNSB $K_{IC}$ | | | | | | |
| $K_{IC}$ | (MPa · m$^{0.5}$) | | | | | |
| | St. Deviation | | | | | |
| DCB $K_{IC}$ | | | | | | |
| $K_{IC}$ | (MPa · m$^{0.5}$) | | | | | |
| | St. Deviation | | | | | |
| Refractive Index | | | | | | |
| Stress Optical Coefficient | | | | | | |
| VFT Parameters | A | -3.221 | -3.297 | -3.184 | -3.227 | -3.085 |
| | B | 8041.9 | 8211.2 | 8038.4 | 8063.7 | 7751.9 |
| | $T_o$ | 112.8 | 106.5 | 118.2 | 122.8 | 143 |
| Liquidus Temperature (° C.) | Air | | | | | |
| | Internal | | | | | |
| | Platinum | | | | | |
| | Primary Phase | | | | | |
| | Secondary Phase | | | | | |
| Liquidus Viscosity (kP) | Air | | | | | |
| | Internal | | | | | |
| | Platinum | | | | | |

| Composition | 56 | 57 | 58 | 59 | 60 |
|---|---|---|---|---|---|
| $SiO_2$ | 64.16 | 64.12 | 64.08 | 64.12 | 64.12 |
| $Al_2O_3$ | 15.67 | 15.65 | 15.65 | 15.66 | 15.67 |
| $P_2O_5$ | 1.11 | 1.11 | 1.11 | 1.11 | 1.12 |
| $B_2O_3$ | 3.23 | 3.24 | 3.23 | 3.24 | 3.24 |

TABLE I-continued

|  |  |  |  |  |  |  |
|---|---|---|---|---|---|---|
|  | MgO | 0.41 | 0.19 | 0.13 | 0.08 | 0.07 |
|  | CaO | 1.75 | 1.74 | 1.75 | 1.74 | 1.75 |
|  | SrO | 1.41 | 1.42 | 1.43 | 1.42 | 1.42 |
|  | ZnO | 0.00 | 0.00 | 0.00 | 0.00 | 0.00 |
|  | $Li_2O$ | 7.41 | 7.68 | 7.76 | 7.76 | 7.76 |
|  | $Na_2O$ | 4.37 | 4.37 | 4.38 | 4.37 | 4.37 |
|  | $K_2O$ | 0.23 | 0.23 | 0.23 | 0.23 | 0.23 |
|  | $TiO_2$ | 0.18 | 0.18 | 0.18 | 0.18 | 0.18 |
|  | $SnO_2$ | 0.05 | 0.05 | 0.05 | 0.05 | 0.05 |
|  | $Fe_2O_3$ | 0.02 | 0.02 | 0.02 | 0.02 | 0.02 |
|  | $ZrO_2$ | 0.01 | 0.01 | 0.00 | 0.01 | 0.01 |
|  | $Li_2O/Na_2O$ | 1.70 | 1.76 | 1.77 | 1.77 | 1.77 |
|  | Density ($g/cm^3$) |  |  |  |  |  |
|  | CTE 0-300° C. (ppm/° C.) |  |  |  |  |  |
| Fiber Elongation | Strain Point (° C.) |  |  |  |  |  |
|  | Annealing Point (° C.) |  |  |  |  |  |
|  | Softening Point (° C.) |  |  |  |  |  |
| BBV | Strain Point (° C.) |  |  |  |  |  |
|  | Annealing Point (° C.) |  |  |  |  |  |
| PPV | Softening Point (° C.) |  |  |  |  |  |
|  | Young's Modulus (GPa) |  |  |  |  |  |
|  | Shear Modulus (GPa) |  |  |  |  |  |
|  | Poisson's ratio |  |  |  |  |  |
| CNSB $K_{IC}$ | $K_{IC}$ ($MPa \cdot m^{0.5}$) |  |  |  |  |  |
|  | St. Deviation |  |  |  |  |  |
| DCB $K_{IC}$ | $K_{IC}$ ($MPa \cdot m^{0.5}$) |  |  |  |  |  |
|  | St. Deviation |  |  |  |  |  |
|  | Refractive Index |  |  |  |  |  |
|  | Stress Optical Coefficient |  |  |  |  |  |
| VFT Parameters | A | −3.713 | −3.406 | −3.196 | −3.158 | −3.266 |
|  | B | 9235.3 | 8582.2 | 8073.8 | 8036.6 | 8213.5 |
|  | $T_o$ | 37.1 | 68.6 | 109.2 | 109.5 | 99.2 |
| Liquidus Temperature (° C.) | Air |  |  |  |  |  |
|  | Internal |  |  |  |  |  |
|  | Platinum |  |  |  |  |  |
|  | Primary Phase |  |  |  |  |  |
|  | Secondary Phase |  |  |  |  |  |
| Liquidus Viscosity (kP) | Air |  |  |  |  |  |
|  | Internal |  |  |  |  |  |
|  | Platinum |  |  |  |  |  |

| Composition | 61 | 62 | 63 | 64 | 65 |
|---|---|---|---|---|---|
| $SiO_2$ | 64.01 | 64.01 | 63.77 | 63.08 | 62.22 |
| $Al_2O_3$ | 15.64 | 15.64 | 15.67 | 15.65 | 15.64 |
| $P_2O_5$ | 1.10 | 1.11 | 1.18 | 1.34 | 1.54 |
| $B_2O_3$ | 3.24 | 3.24 | 2.97 | 2.64 | 2.20 |
| MgO | 0.06 | 0.05 | 0.24 | 0.68 | 1.22 |
| CaO | 1.74 | 1.74 | 1.65 | 1.45 | 1.20 |
| SrO | 1.42 | 1.42 | 1.34 | 1.18 | 0.97 |
| ZnO | 0.00 | 0.00 | 0.03 | 0.15 | 0.30 |
| $Li_2O$ | 7.93 | 7.93 | 7.94 | 7.98 | 7.99 |
| $Na_2O$ | 4.36 | 4.37 | 4.72 | 5.40 | 6.31 |
| $K_2O$ | 0.23 | 0.23 | 0.22 | 0.19 | 0.16 |
| $TiO_2$ | 0.18 | 0.18 | 0.17 | 0.16 | 0.15 |
| $SnO_2$ | 0.05 | 0.05 | 0.05 | 0.05 | 0.05 |
| $Fe_2O_3$ | 0.02 | 0.02 | 0.02 | 0.02 | 0.02 |
| $ZrO_2$ | 0.01 | 0.01 | 0.02 | 0.02 | 0.02 |
| $Li_2O/Na_2O$ | 1.82 | 1.82 | 1.68 | 1.48 | 1.27 |
| Density ($g/cm^3$) |  |  |  |  |  |
| CTE 0-300° C. (ppm/° C.) |  |  |  |  |  |

TABLE I-continued

| | | | | | | |
|---|---|---|---|---|---|---|
| Fiber Elongation | Strain Point (° C.) | | | | | |
| | Annealing Point (° C.) | | | | | |
| | Softening Point (° C.) | | | | | |
| BBV | Strain Point (° C.) | | | | | |
| | Annealing Point (° C.) | | | | | |
| PPV | Softening Point (° C.) | | | | | |
| Young's Modulus (GPa) | | | | | | |
| Shear Modulus (GPa) | | | | | | |
| Poisson's ratio | | | | | | |
| CNSB $K_{IC}$ | $K_{IC}$ (MPa · m$^{0.5}$) | | | | | |
| | St. Deviation | | | | | |
| DCB $K_{IC}$ | $K_{IC}$ (MPa · m$^{0.5}$) | | | | | |
| | St. Deviation | | | | | |
| Refractive Index | | | | | | |
| Stress Optical Coefficient | | | | | | |
| VFT Parameters | A | −3.298 | −3.357 | −3.041 | −3.320 | −3.360 |
| | B | 8361.2 | 8439.3 | 7876.7 | 8422.1 | 8580.1 |
| | $T_o$ | 87 | 77.8 | 108.3 | 63.4 | 29.7 |
| Liquidus Temperature (° C.) | Air | | | | | |
| | Internal | | | | | |
| | Platinum | | | | | |
| | Primary Phase | | | | | |
| | Secondary Phase | | | | | |
| Liquidus Viscosity (kP) | Air | | | | | |
| | Internal | | | | | |
| | Platinum | | | | | |

| Composition | | 66 |
|---|---|---|
| | $SiO_2$ | 64.90 |
| | $Al_2O_3$ | 15.53 |
| | $P_2O_5$ | 0.86 |
| | $B_2O_3$ | 3.21 |
| | MgO | 0.54 |
| | CaO | 1.46 |
| | SrO | 1.07 |
| | ZnO | 0.00 |
| | $Li_2O$ | 7.20 |
| | $Na_2O$ | 4.78 |
| | $K_2O$ | 0.21 |
| | $TiO_2$ | 0.18 |
| | $SnO_2$ | 0.04 |
| | $Fe_2O_3$ | 0.02 |
| | $ZrO_2$ | 0.00 |
| | $Li_2O/Na_2O$ | 1.51 |
| | Density (g/cm$^3$) | 2.410 |
| CTE 0-300° C. (ppm/° C.) | | 58.8 |
| Fiber Elongation | Strain Point (° C.) | 579 |
| | Annealing Point (° C.) | 631 |
| | Softening Point (° C.) | 877.9 |
| BBV | Strain Point (° C.) | 584.7 |
| | Annealing Point (° C.) | 635.1 |
| PPV | Softening Point (° C.) | 885.7 |

TABLE I-continued

| | | |
|---|---|---|
| Young's Modulus (GPa) | | 78.6 |
| Shear Modulus (GPa) | | 32.2 |
| Poisson's ratio | | 0.221 |
| CNSB $K_{IC}$ | $K_{IC}$ (MPa·m$^{0.5}$) | |
| | St. Deviation | |
| DCB $K_{IC}$ | $K_{IC}$ (MPa·m$^{0.5}$) | 0.818 |
| | St. Deviation | 0.011 |
| Refractive Index | | 1.5101 |
| Stress Optical Coefficient | | 3.081 |
| VFT Parameters | A | −3.353 |
| | B | 8441.7 |
| | $T_o$ | 99.4 |
| Liquidus Temperature (° C.) | Air | 1130 |
| | Internal | 1125 |
| | Platinum | 1120 |
| | Primary Phase | Spodumene |
| | Secondary Phase | |
| Liquidus Viscosity (kP) | Air | 68.9 |
| | Internal | 75.5 |
| | Platinum | 82.9 |

Substrates with a thickness of 0.5 mm were formed from the compositions of Table I, and subsequently ion exchanged to form example articles. The ion exchange included submerging the substrates into a molten salt bath. The salt bath included 100 wt % NaNO$_3$ and was at a temperature of 420° C. In Table II, the length of the ion exchange and the weight gain produced by the ion exchange treatment and the maximum central tension (CT) of the ion exchanged articles are reported. The maximum central tension (CT) was measured according to the methods described herein.

TABLE II

| Article | A | B | C | D | E | F |
|---|---|---|---|---|---|---|
| Composition | 13 | 14 | 15 | 16 | 17 | 18 |
| Time (h) | 3 | 3 | 3 | 3 | 3 | 3 |
| CT (MPa) | 121.4 | 122.0 | 120.1 | 123.7 | 119.0 | 119.5 |
| Weight Gain (%) | 1.004 | 0.923 | 0.933 | 1.053 | 0.899 | 0.947 |

| Article | G | H | I | J | K | L |
|---|---|---|---|---|---|---|
| Composition | 13 | 14 | 15 | 16 | 17 | 18 |
| Time (h) | 4 | 4 | 4 | 4 | 4 | 4 |
| CT (MPa) | 110.6 | 120.5 | 121.5 | 123.5 | 125.4 | 126.5 |
| Weight Gain (%) | 1.174 | 1.095 | 1.076 | 1.213 | 1.064 | 1.126 |

| Article | M | N | O | P | Q | R |
|---|---|---|---|---|---|---|
| Composition | 13 | 14 | 15 | 16 | 17 | 18 |
| Time (h) | 5 | 5 | 5 | 5 | 5 | 5 |
| CT (MPa) | 108.1 | 117.7 | 121.2 | 115.5 | 127.9 | 122.7 |
| Weight Gain (%) | 1.331 | 1.250 | 1.220 | 1.395 | 1.171 | 1.267 |

| Article | S | T | U | V | W | X |
|---|---|---|---|---|---|---|
| Composition | 13 | 14 | 15 | 16 | 17 | 18 |
| Time (h) | 6 | 6 | 6 | 6 | 6 | 6 |
| CT (MPa) | 104.2 | 115.5 | 116.7 | 109.6 | 121.4 | 119.6 |
| Weight Gain (%) | 1.421 | 1.345 | 1.311 | 1.518 | 1.282 | 1.364 |

TABLE II-continued

| Article | Y | Z | AA | AB | AC | AD |
|---|---|---|---|---|---|---|
| Composition | 19 | 20 | 21 | 22 | 23 | 24 |
| Time (h) | 3 | 3 | 3 | 3 | 3 | 3 |
| CT (MPa) | 111.6 | 116.7 | 120.0 | 122.3 | 124.5 | 125.7 |
| Weight Gain (%) | 0.942 | 0.868 | 0.904 | 0.830 | 0.840 | 0.843 |
| Article | AE | AF | AG | AH | AI | AJ |
| Composition | 19 | 20 | 21 | 22 | 23 | 24 |
| Time (h) | 4 | 4 | 4 | 4 | 4 | 4 |
| CT (MPa) | 128.5 | 109.1 | 120.1 | 122.6 | 126.2 | 128.6 |
| Weight Gain (%) | 1.087 | 1.005 | 1.041 | 0.921 | 0.975 | 1.002 |
| Article | AK | AL | AM | AN | AO | AP |
| Composition | 19 | 20 | 21 | 22 | 23 | 24 |
| Time (h) | 5 | 5 | 5 | 5 | 5 | 5 |
| CT (MPa) | 102.0 | 119.0 | 116.0 | 127.0 | 130.0 | 127.0 |
| Weight Gain (%) | 1.233 | 1.185 | 1.196 | 1.036 | 1.071 | 1.175 |
| Article | AQ | AR | AS | AT | AU | AV |
| Composition | 19 | 20 | 21 | 22 | 23 | 24 |
| Time (h) | 6 | 6 | 6 | 6 | 6 | 6 |
| CT (MPa) | 97.0 | 112.0 | 114.0 | 126.0 | 124.0 | 124.0 |
| Weight Gain (%) | 1.369 | 1.268 | 1.270 | 1.146 | 1.207 | 1.273 |
| Article | AW | AX | AY | AZ | BA | BB |
| Composition | 25 | 26 | 27 | 28 | 29 | 30 |
| Time (h) | 1 | 1 | 1 | 1 | 1 | 1 |
| CT (MPa) | 114.1 | 121.8 | 131.6 | 117.3 | 129.0 | 138.9 |
| Weight Gain (%) | 0.383 | 0.750 | 0.878 | 0.767 | 0.824 | 0.900 |
| Article | BC | BD | BE | BF | BG | BH |
| Composition | 25 | 26 | 27 | 28 | 29 | 30 |
| Time (h) | 2 | 2 | 2 | 2 | 2 | 2 |
| CT (MPa) | 129.4 | 137.6 | 143.2 | 138.0 | 145.4 | 145.9 |
| Weight Gain (%) | 0.975 | 1.116 | 1.234 | 1.023 | 1.151 | 1.349 |
| Article | BI | BJ | BK | BL | BM | BN |
| Composition | 25 | 26 | 27 | 28 | 29 | 30 |
| Time (h) | 3 | 3 | 3 | 3 | 3 | 3 |
| CT (MPa) | 127.7 | 129.6 | 132.9 | 134.8 | 135.3 | 135.0 |
| Weight Gain (%) | 1.284 | 1.361 | 1.521 | 1.300 | 1.429 | 1.625 |
| Article | BO | BP | BQ | BR | BS | BT |
| Composition | 25 | 26 | 27 | 28 | 29 | 30 |
| Time (h) | 4 | 4 | 4 | 4 | 4 | 4 |
| CT (MPa) | 117.1 | 118.0 | 121.6 | 125.2 | 124.8 | 124.9 |
| Weight Gain (%) | 1.506 | 1.657 | 1.772 | 1.510 | 1.650 | 1.842 |

Figure 5:
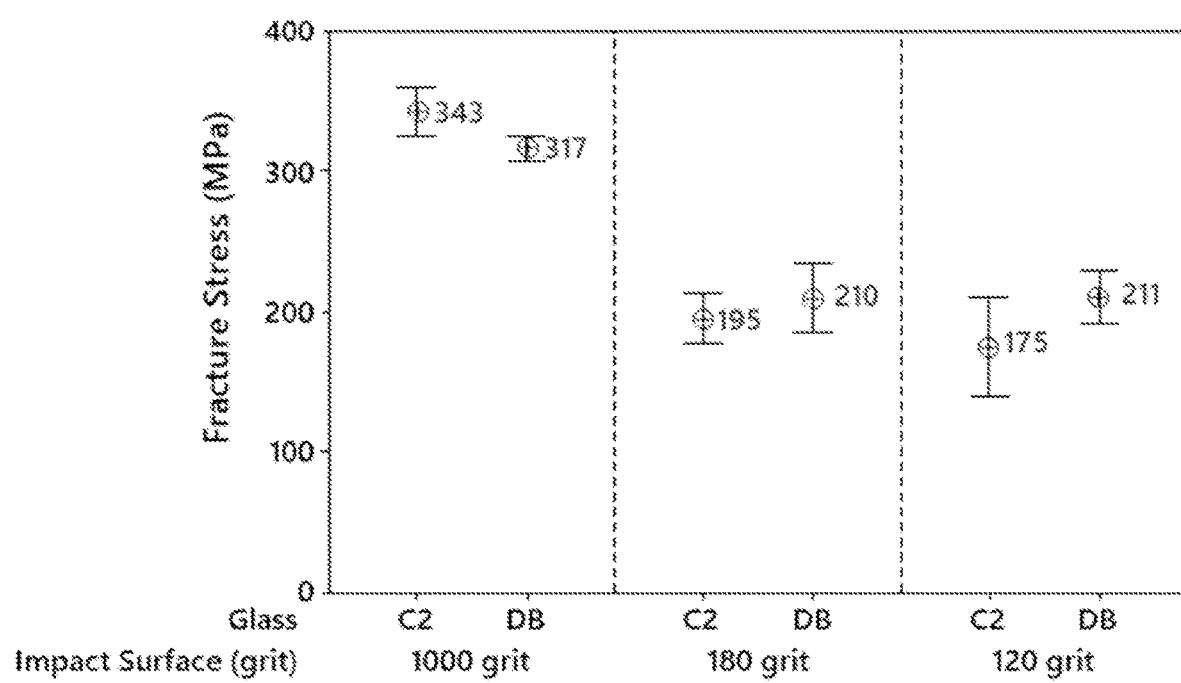
FIG. 5 is a graph of the fracture stress after surface impact as a function of surface roughness for articles formed from a composition according to an embodiment and articles formed from a comparative composition.

Substrates were formed from composition 31 of Table I and from comparative composition C1. Comparative composition C1 as analyzed included 63.31 mol % $SiO_2$, 15.2 mol % $Al_2O_3$, 6.74 mol % $B_2O_3$, 4.30 mol % $Na_2O$, 6.82 mol % $Li_2O$, 1.00 mol % MgO, 1.55 mol % CaO, 1.02 mol % SrO, and 0.05 mol % $SnO_2$. Articles DD, DE, and DF in Table III were formed from comparative composition D1 and are comparative examples for this reason. The substrates were subjected to a two-step ion exchange process, where the substrates were submerged in a first molten salt bath and then submerged in a second molten salt bath. All molten salt baths were at a temperature of 420° C., with the composition and ion exchange time for each bath reported in Table III. The thickness, refractive index at 589.3 nm, and stress optical coefficient (SOC) of the substrates are also reported in Table III. The central tension of the articles was measured after ion exchange with the first ion exchange bath ($CT_1$) and after the conclusion the ion exchange treatment with the second ion exchange bath ($CT_2$). In addition, the compressive stress and the depth of the spike (DOLsp) of the articles were measured after the conclusion of the ion exchange treatment with the second ion exchange bath.

the surface impact. A comparative article was formed by ion exchanging a 0.5 mm thick substrate formed from comparative composition C2 in a first molten salt bath with a composition of 40 wt % $NaNO_3$ and 60 wt % $KNO_3$, at a temperature of 430° C., for a time of 1 hour and 25 minutes followed by ion exchanging in a second molten salt bath with a composition of 1 wt % $NaNO_3$ and 99 wt % $KNO_3$, at a temperature of 380° C., for a time of 25 minutes. Comparative composition C2 as analyzed included 59.09 mol % $SiO_2$, 17.94 mol % $Al_2O_3$, 4.08 mol % $B_2O_3$, 8.79 mol % $Na_2O$, 8.00 mol % $Li_2O$, 0.07 mol % $K_2O$, 1.23 mol % MgO, 0.01 mol % ZnO, 0.02 mol % CaO, 0.66 mol % $P_2O_5$, and 0.04 mol % $SnO_2$. The comparative articles form formed from comparative composition C2 exhibited a higher CT value but lower DOC when compared to article DB. The comparative articles formed from comparative composition C2 were subjected to the same surface impact testing and four-point bend test as article DB. The results of the surface impact and four-point bend testing are shown in FIG. 5, with article DB exhibiting improved performance for greater flaw depths due at least in part to the deeper DOC.

TABLE III

| Article | | DA | DB | DC | DD | DE | DE |
|---|---|---|---|---|---|---|---|
| Composition | | 31 | 31 | 31 | C1 | C1 | C1 |
| Thickness (mm) | | 0.501 | 0.519 | 0.503 | 0.506 | 0.498 | 0.501 |
| Refractive Index | | 1.5139 | 1.5139 | 1.5139 | 1.5107 | 1.5107 | 1.5107 |
| SOC | | 3.040 | 3.040 | 3.040 | 3.177 | 3.177 | 3.177 |
| IOX Bath 1 | $KNO_3$ (wt %) | 20 | 20 | 20 | 20 | 20 | 20 |
| | $NaNO_3$ (wt %) | 80 | 80 | 80 | 80 | 80 | 80 |
| | Time (h) | 2.25 | 2.50 | 2.75 | 2.25 | 2.50 | 2.75 |
| $CT_1$ (MPa) | | 128.9 | 127.2 | 128.9 | 102.4 | 103.4 | 107.4 |
| IOX Bath 2 | $KNO_3$ (wt %) | 100 | 100 | 100 | 100 | 100 | 100 |
| | $NaNO_3$ (wt %) | 0 | 0 | 0 | 0 | 0 | 0 |
| | Time (h) | 0.5 | 0.5 | 0.5 | 0.5 | 0.5 | 0.5 |
| CS (MPa) | | 1250 | 1280 | 1259 | 1247 | 1220 | |
| $DOL_{sp}$ (μm) | | 3.7 | 3.7 | 3.7 | 3.0 | 3.0 | 3.0 |
| $CT_2$ (MPa) | | 117.4 | 113.2 | 114.8 | 99.2 | 102.7 | 102.8 |

Figure 3:
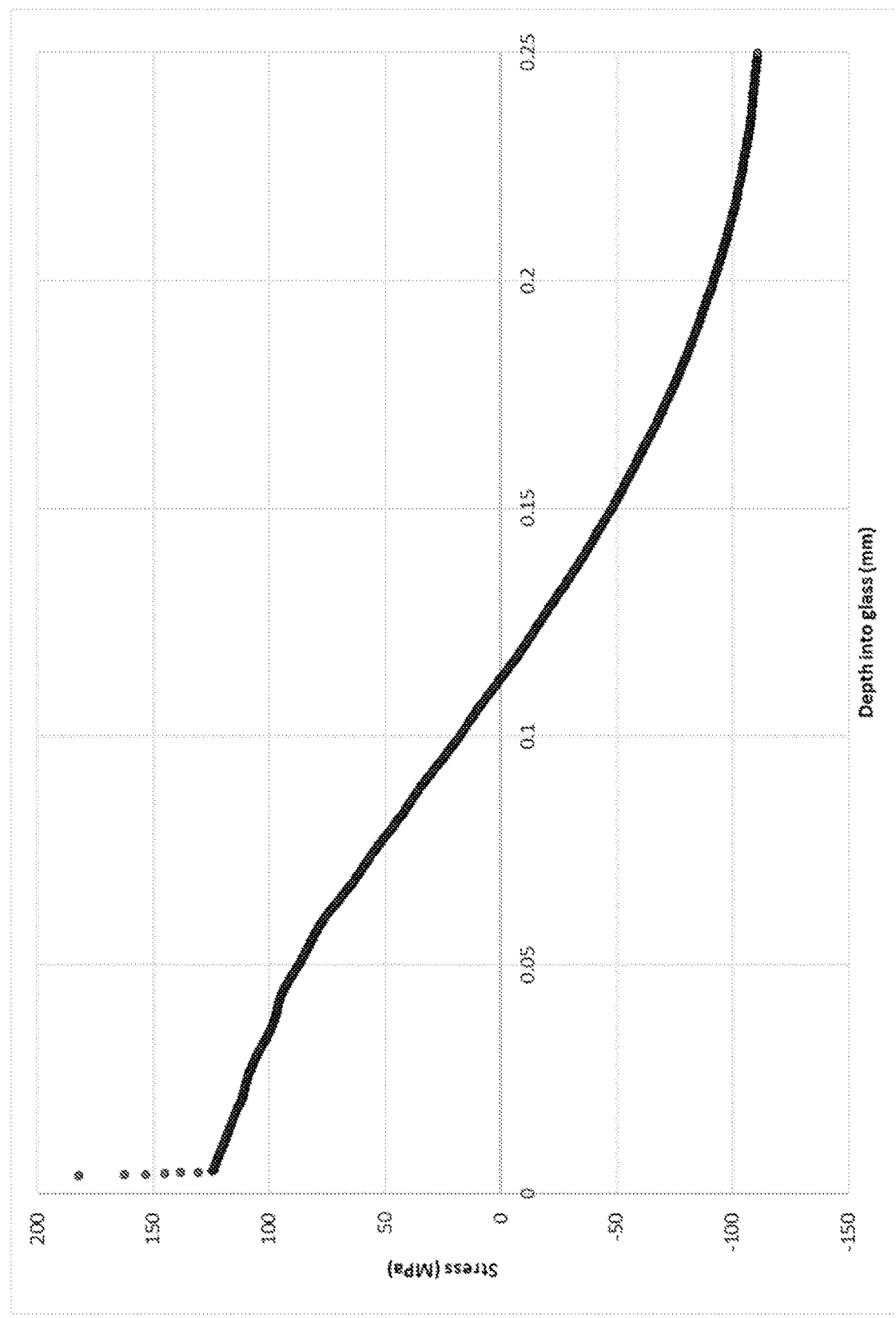
FIG. 3 is a plot of stress as a function of depth from a surface into the glass article for a glass-based article according to an embodiment.

The stress profile of article DB of Table III was measured with RNF, as shown in FIG. 3. Article DB had a depth of compression (DOC) of 111 μm, about 22% of the thickness.

Figure 4:
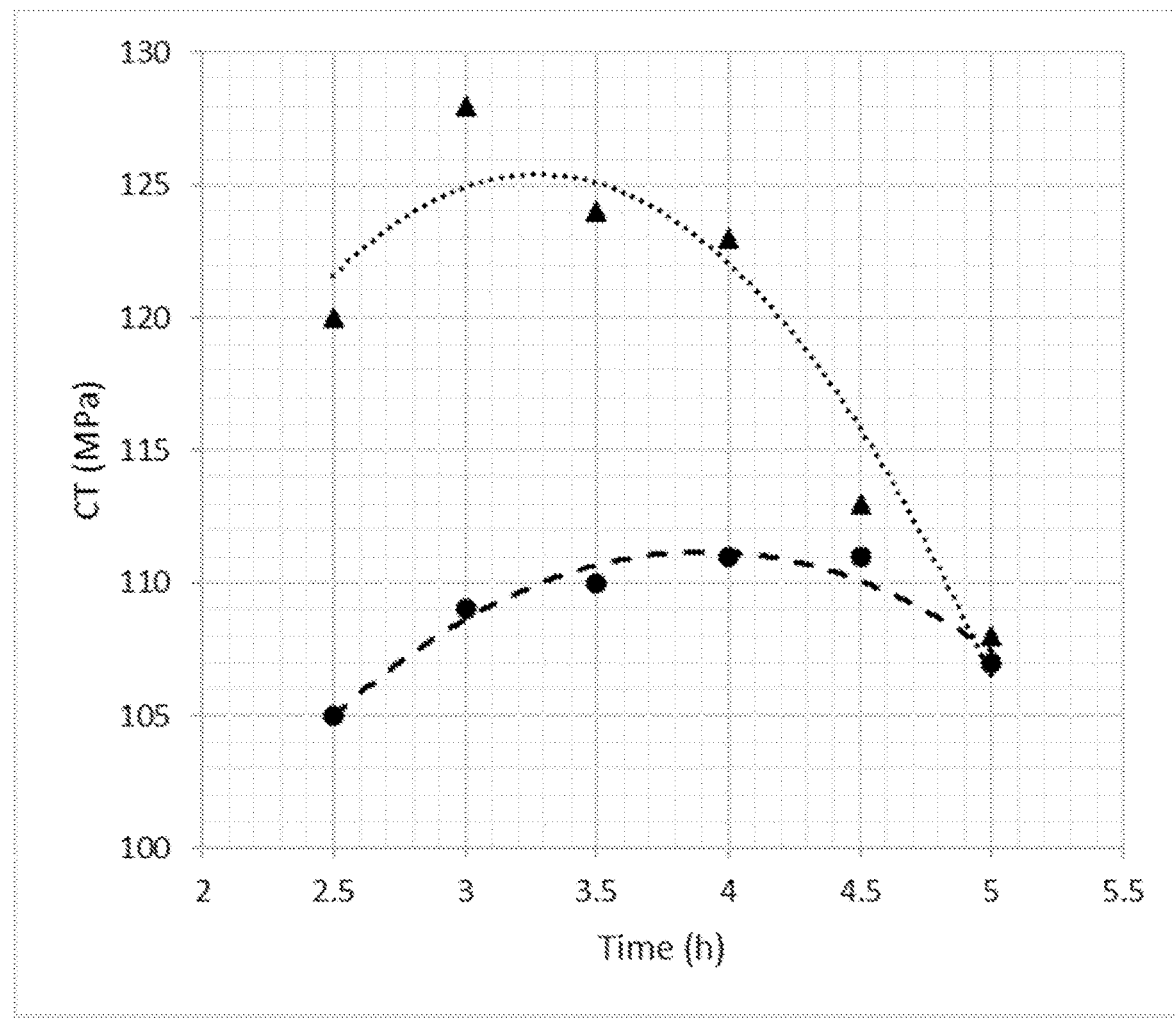
FIG. 4 is a plot of CT as a function of ion exchange time for articles formed from a composition according to an embodiment and articles formed from a comparative composition.

Substrates were formed from composition 31 of Table I and from comparative composition C1, with the substrates all having the same thickness of 0.5 mm. The substrates were subjected to ion exchange in a molten salt bath with a composition of 100 wt % $NaNO_3$, at a temperature of 420° C., for times ranging from 2.5 hours to 5 hours. The CT of the articles produced by the ion exchange treatment was measured and is plotted as a function of ion exchange time in FIG. 4. The substrates formed from composition 31 (triangles) achieved higher CT values than the substrates formed from comparative composition C1 (circles), as shown in FIG. 4.

Figure 6:
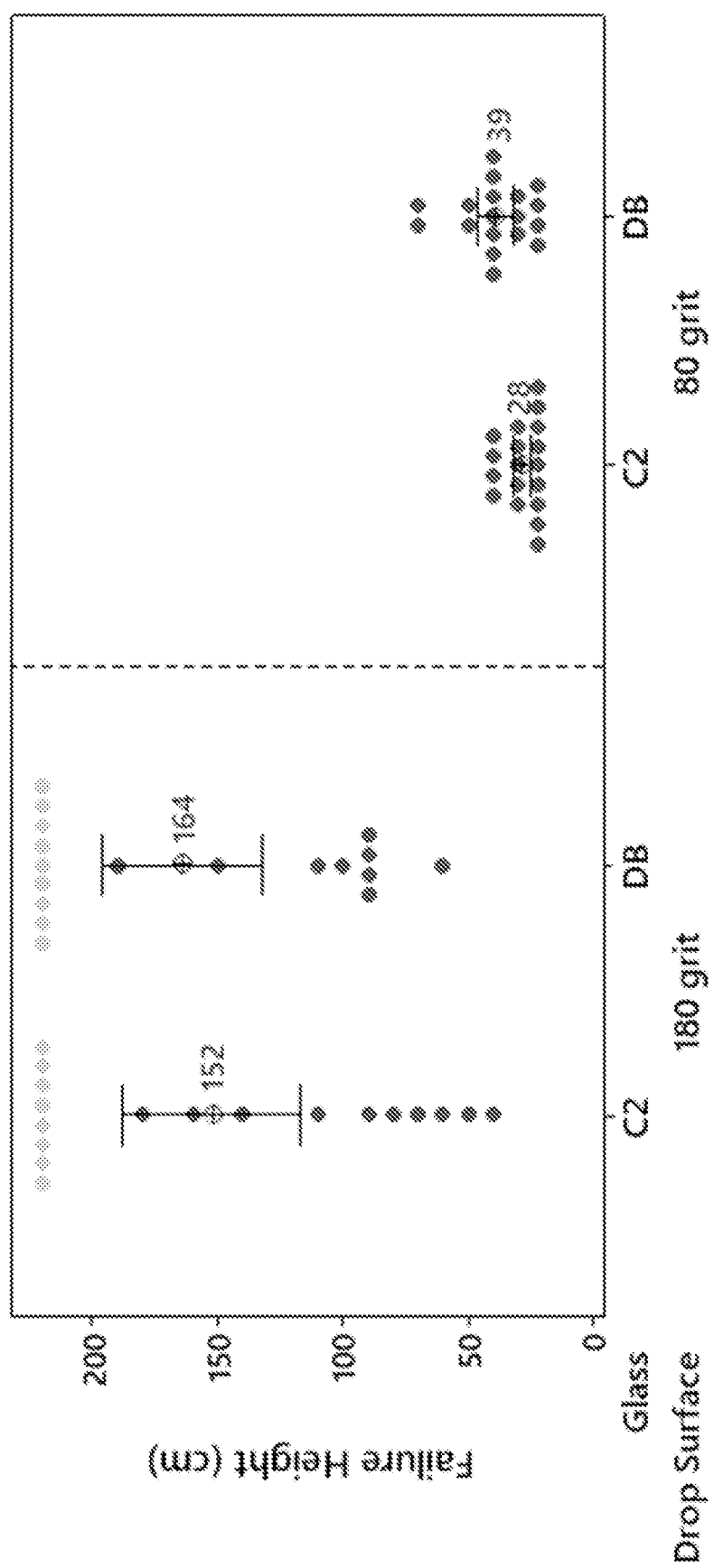
FIG. 6 is a plot of failure height as a function of surface roughness for an incremental flat face drop test for articles formed from a composition according to an embodiment and articles formed from a comparative composition.

Article DB was subjected to surface impact testing, with the impact surface having various grit levels, and the fracture stress was measured using a four-point bend test after The article DB and the articles formed from comparative composition C2 were also subjected to an incremental flat face drop test onto rough surfaces. The test articles were loaded into a puck simulating a mobile electronic device and dropped at progressively greater heights onto surfaces with a roughness of either 80 grit or 180 grit. Eighteen samples were tested at each surface roughness. For 180 grit, both article DB and the articles formed from comparative composition C2 had multiple samples that survived at the greatest drop height with the article DB samples having an 8% greater mean failure height than the C2 samples. For 80 grit, the article DB samples had a 39% greater mean failure height than the C2 samples. The improved performance of the article DB samples is likely due to the increased DOC when compared to the C2 samples, especially for the rougher surface. The results of the drop tests are shown in FIG. 6.

Substrates were formed from composition 66 of Table I, and subsequently ion exchanged to form example articles.

Figure 8:
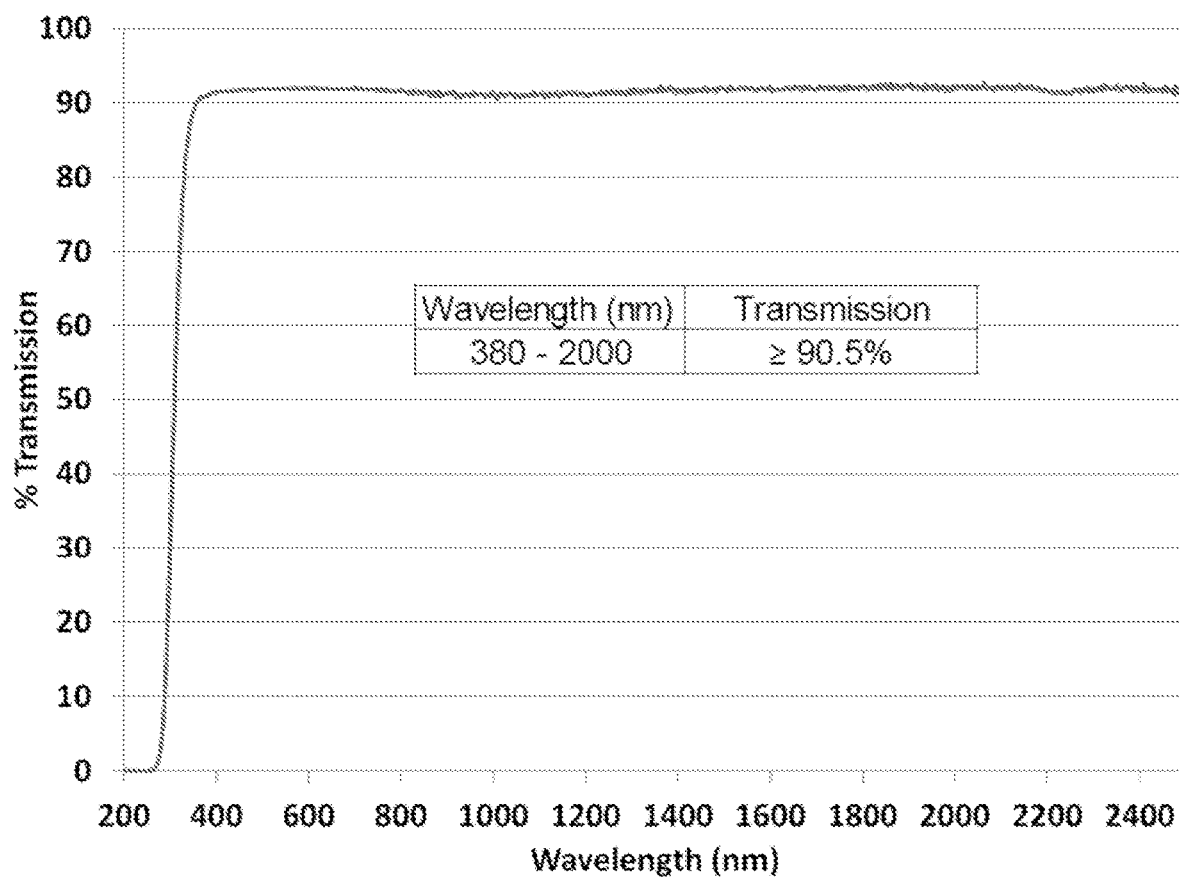
FIG. 8 is a graph of the percent transmission as a function of wavelength for articles formed from a composition according to an embodiment.

The ion exchange included submerging the substrates into a molten salt bath. The transmission of the ion exchanged example articles was measured at a thickness of 0.7 mm, with the percent transmission shown as a function of wavelength in FIG. 8. The ion exchanged example articles exhibited a transmittance of greater than or equal to 90.5% over the wavelength range of 380 nm to 2000 nm. The refractive index of the compressive stress layer of the ion exchanged example articles was also measured at 590 nm and found to be 1.52. The photo-elastic constant of the ion exchanged example articles was measured to be 30.8 nm/cm/MPa. The Vickers hardness was measured with a 200 g load for the example substrates (prior to ion exchange) and for the ion exchanged example articles (after ion exchange), returning values of 595 kgf/mm$^2$ and 670 kgf/mm$^2$, respectively. The ion exchanged example articles were tested for chemical durability by immersion in solvents at a specific temperature for a specific time and the resulting weight loss per surface area was measured, as shown in Table IV.

TABLE IV

| Solvent | Time | Temperature (° C.) | Weight Loss (mg/cm$^2$) |
| --- | --- | --- | --- |
| HCl - 5% | 24 hrs. | 95 | 3.6 |
| NH$_4$F:HF - 10% | 20 min. | 20 | 1.3 |
| HF - 10% | 20 min. | 20 | 14.6 |
| NaOH - 5% | 6 hrs. | 95 | 2.2 |

The dielectric constant and loss tangent of the ion exchanged example articles formed from composition 66 was also measured at a variety of frequencies, as reported in Table V.

TABLE V

| Frequency (MHz) | Dielectric Constant | Loss Tangent |
| --- | --- | --- |
| 54 | 6.45 | 0.008 |
| 163 | 6.41 | 0.008 |
| 272 | 6.4 | 0.009 |
| 381 | 6.38 | 0.009 |
| 490 | 6.38 | 0.008 |
| 599 | 6.37 | 0.009 |
| 912 | 6.39 | 0.010 |
| 1499 | 6.37 | 0.010 |
| 1977 | 6.36 | 0.011 |
| 2466 | 6.34 | 0.011 |
| 2986 | 6.33 | 0.012 |

All compositional components, relationships, and ratios described in this specification are provided in mol % unless otherwise stated. All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. A glass, comprising:
   greater than or equal to 60 mol % to less than or equal to 66 mol % SiO$_2$;
   greater than or equal to 14 mol % to less than or equal to 16 mol % Al$_2$O$_3$;
   greater than or equal to 7 mol % to less than or equal to 9 mol % Li$_2$O;
   greater than or equal to 4 mol % to less than or equal to 6 mol % Na$_2$O;
   greater than or equal to 0.5 mol % to less than or equal to 3 mol % P$_2$O$_5$;
   greater than or equal to 0.5 mol % to less than or equal to 5 mol % B$_2$O$_3$; and
   greater than or equal to 0.1 mol % to less than or equal to 1 mol % TiO$_2$.

2. The glass of claim 1, comprising:
   greater than 0 mol % to less than or equal to 0.5 mol % K$_2$O.

3. The glass of claim 1, comprising:
   greater than or equal to 0.1 mol % to less than or equal to 0.5 mol % TiO$_2$.

4. The glass of claim 1, comprising:
   greater than or equal to 0 mol % to less than or equal to 4 mol % MgO.

5. The glass of claim 1, comprising:
   greater than or equal to 0 mol % to less than or equal to 3 mol % CaO.

6. The glass of claim 1, comprising:
   greater than or equal to 0 mol % to less than or equal to 4 mol % SrO.

7. The glass of claim 1, comprising:
   greater than or equal to 0 mol % to less than or equal to 1 mol % ZnO.

8. The glass of claim 1, wherein a molar ratio of Li$_2$O/Na$_2$O is greater than or equal to 1.2 to less than or equal to 2.0.

9. The glass of claim 1, wherein the glass has a liquidus viscosity in the range from greater than or equal to 50 kP to less than or equal to 75 kP.

10. The glass of claim 1, wherein the glass has a K$_{IC}$ fracture toughness greater than or equal to 0.75 MPa·m$^{0.5}$.

11. A method, comprising:
   ion exchanging a glass-based substrate in a molten salt bath to form a glass-based article,
   wherein the glass-based article comprises a compressive stress layer extending from a surface of the glass-based article to a depth of compression, the glass-based article comprises a central tension region, and the glass-based substrate comprises the glass of claim 1.

12. The method of claim 11, wherein the molten salt bath comprises NaNO$_3$.

13. The method of claim 11, wherein the molten salt bath comprises KNO$_3$.

14. The method of claim 11, wherein the molten salt bath is at a temperature greater than or equal to 380° C. to less than or equal to 470° C.

15. The method of claim 11, wherein the ion exchanging extends for a time period greater than or equal to 10 minutes to less than or equal to 24 hours.

16. The method of claim 11, further comprising ion exchanging the glass-based article in a second molten salt bath.

17. The method of claim 16, wherein the second molten salt bath comprises KNO$_3$.

18. A glass-based article, comprising:
   a compressive stress layer extending from a surface of the glass-based article to a depth of compression;
   a central tension region; and
   a composition at a center of the glass-based article comprising:

greater than or equal to 60 mol % to less than or equal to 66 mol % $SiO_2$;

greater than or equal to 14 mol % to less than or equal to 16 mol % $Al_2O_3$;

greater than or equal to 7 mol % to less than or equal to 9 mol % $Li_2O$;

greater than or equal to 4 mol % to less than or equal to 6 mol % $Na_2O$;

greater than or equal to 0.5 mol % to less than or equal to 3 mol % $P_2O_5$;

greater than or equal to 0.5 mol % to less than or equal to 5 mol % $B_2O_3$; and greater than or equal to 0.1 mol % to less than or equal to 1 mol % $TiO_2$.

19. The glass-based article of claim 18, wherein the compressive stress layer comprises a compressive stress greater than or equal to 500 MPa to less than or equal to 1500 MPa.

20. The glass-based article of claim 18, wherein the central tension region comprises a maximum central tension greater than or equal to 60 MPa to less than or equal to 160 MPa.

21. The glass-based article of claim 18, wherein the depth of compression is greater than or equal to 0.20t to less than or equal to 0.25t, where t is the thickness of the glass-based article.

22. The glass-based article of claim 18, wherein the compressive stress layer comprises a compressive stress spike extending from the surface of the glass-based article to a depth of compressive stress spike, and the depth of compressive stress spike is greater than or equal to 3 μm to less than or equal to 10 μm.

23. The glass-based article of claim 18, wherein the glass-based article has a thickness t greater than or equal to 0.2 mm to less than or equal to 2 mm.

24. The glass-based article of claim 18, wherein the composition at the center of the glass-based article comprises greater than 0 mol % to less than or equal to 0.5 mol % $K_2O$.

25. The glass-based article of claim 18, wherein the composition at the center of the glass-based article comprises greater than or equal to 0.1 mol % to less than or equal to 0.5 mol % $TiO_2$.

26. The glass-based article of claim 18, wherein the composition at the center of the glass-based article comprises greater than or equal to 0 mol % to less than or equal to 4 mol % MgO.

27. The glass-based article of claim 18, wherein the composition at the center of the glass-based article comprises greater than or equal to 0 mol % to less than or equal to 3 mol % CaO.

28. The glass-based article of claim 18, wherein the composition at the center of the glass-based article comprises greater than or equal to 0 mol % to less than or equal to 4 mol % SrO.

29. The glass-based article of claim 18, wherein the composition at the center of the glass-based article comprises greater than or equal to 0 mol % to less than or equal to 1 mol % ZnO.

30. A consumer electronic product, comprising:

a housing having a front surface, a back surface and side surfaces;

electrical components provided at least partially within the housing, the electrical components including at least a controller, a memory, and a display, the display being provided at or adjacent the front surface of the housing; and a cover substrate disposed over the display, wherein at least a portion of at least one of the housing and the cover substrate comprises the glass-based article of claim 18.

* * * * *